(12) United States Patent
Lesso et al.

(10) Patent No.: US 9,716,945 B2
(45) Date of Patent: Jul. 25, 2017

(54) SIGNAL PROCESSING FOR MEMS CAPACITIVE TRANSDUCERS

(71) Applicant: Cirrus Logic International Semiconductor Ltd., Edinburgh (GB)

(72) Inventors: John Paul Lesso, Edinburgh (GB); Emmanuel Philippe Christian Hardy, Edinburgh (GB); James Thomas Deas, Edinburgh (GB); Toru Ido, Yokohama (JP)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 0 days.

(21) Appl. No.: 14/787,052

(22) PCT Filed: Apr. 23, 2014

(86) PCT No.: PCT/GB2014/051262
§ 371 (c)(1),
(2) Date: Oct. 26, 2015

(87) PCT Pub. No.: WO2014/174283
PCT Pub. Date: Oct. 30, 2014

(65) Prior Publication Data
US 2016/0157017 A1    Jun. 2, 2016

(30) Foreign Application Priority Data
Apr. 26, 2013    (GB) .................................. 1307576.7

(51) Int. Cl.
*H04R 19/00*    (2006.01)
*H04R 3/06*     (2006.01)
(Continued)

(52) U.S. Cl.
CPC ................ *H04R 3/06* (2013.01); *G01D 5/24* (2013.01); *G01D 5/24476* (2013.01);
(Continued)

(58) Field of Classification Search
CPC ........ G01D 5/24476; G01D 5/24; G01D 3/02; G01P 15/125; G01P 2015/0865;
(Continued)

(56) References Cited

U.S. PATENT DOCUMENTS 8,965,008 B2 * 2/2015 Nystrom ................ H04R 3/007
                                                       381/111
2008/0075306 A1 * 3/2008 Poulsen ............... H04R 19/005
                                                       381/111
(Continued)

FOREIGN PATENT DOCUMENTS

EP       2421281 A2      2/2012
GB       2459862 A      11/2009
WO    2013182901 A1     12/2013

OTHER PUBLICATIONS

International Search Report and Written Opinion, International Patent Application No. PCT/GB2014/051262, mailed Dec. 12, 2013, 18 pages.

(Continued)

Primary Examiner — Melur Ramakrishnaiah
(74) Attorney, Agent, or Firm — Jackson Walker L.L.P.

(57) ABSTRACT

This application relates to circuitry for processing sense signals generated by MEMS capacitive transducers for compensating for distortion in such sense signals. The circuitry has a signal path between an input (204) for receiving the sense signal and an output (205) for outputting an output signal based on said sense signal. Compensation circuitry (206, 207) is configured to monitor the signal at a first point along the signal path and generate a correction signal ($S_{corr}$); and modify the signal at at least a second point along said signal path based on said correction signal. The correction signal is generated as a function of the value of the signal at the first point along the signal path so as to introduce compensation components into the output signal that com- (Continued)

pensate for distortion components in the sense signal. The first point in the signal path may be before or after the second point in the signal path. The monitoring may be performed in an analogue or a digital part of the signal path and in either case the modification may be applied in an analogue or a digital part of the signal path.

20 Claims, 9 Drawing Sheets

(51) Int. Cl.
| | |
|---|---|
| *G01D 5/244* | (2006.01) |
| *G01P 15/125* | (2006.01) |
| *G01D 5/24* | (2006.01) |
| *H03M 1/06* | (2006.01) |
| *H03M 3/00* | (2006.01) |
| *H04R 19/04* | (2006.01) |
| *H04R 29/00* | (2006.01) |
| *G01P 15/08* | (2006.01) |
| *G01D 3/02* | (2006.01) |
| *H03M 1/12* | (2006.01) |

(52) U.S. Cl.
CPC ......... *G01P 15/125* (2013.01); *H03M 1/0609* (2013.01); *H03M 3/352* (2013.01); *H04R 19/005* (2013.01); *H04R 19/04* (2013.01); *G01D 3/02* (2013.01); *G01P 2015/0865* (2013.01); *H03M 1/12* (2013.01); *H03M 3/458* (2013.01); *H04R 29/004* (2013.01); *H04R 2201/003* (2013.01); *H04R 2499/11* (2013.01)

(58) Field of Classification Search
CPC ........ H04R 3/06; H04R 19/005; H04R 19/04; H04R 2499/11; H04R 2201/003; H04R 29/004; H03M 1/0609; H03M 3/352; H03M 3/458
USPC ........................ 381/71.7, 106, 107, 174, 369
See application file for complete search history.

(56) References Cited

U.S. PATENT DOCUMENTS

| | | | | |
|---|---|---|---|---|
| 2010/0315272 | A1* | 12/2010 | Steele ................... | G01D 3/032 341/110 |
| 2011/0188687 | A1* | 8/2011 | Song .................... | H04R 25/00 381/321 |
| 2013/0271307 | A1* | 10/2013 | Kropfitsch ............ | H03G 3/002 341/158 |
| 2014/0086433 | A1* | 3/2014 | Josefsson ............... | H04R 3/06 381/98 |

OTHER PUBLICATIONS

Zhou et al., "Precompensated excitation waveforms to suppress harmonic generation in MEMS electrostatic transducers", IEEE Transactions on Ultrasonics, Ferroelectrics and Frequency Control, IEEE, US., vol. 51, No. 11, Nov. 1, 2004, pp. 1564-1574.

Jawed, Arsalan Syed, "PhD Dissertation International Doctorate School in Information and Communication Technologies CMOS Readout Interfaces for MEMS Capacitive Microphones", Mar. 31, 2009, http://eprints-phd.biblio.unitn.it/82/1/thesis_mems_microphone_readout.pdf.

* cited by examiner

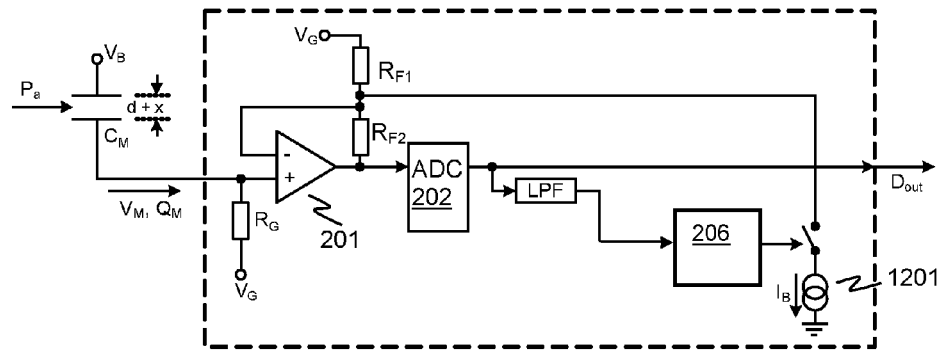
Figure 12a
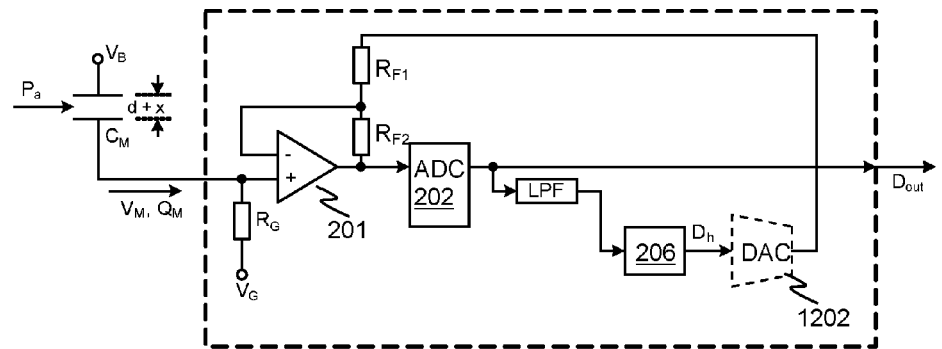
Figure 12b
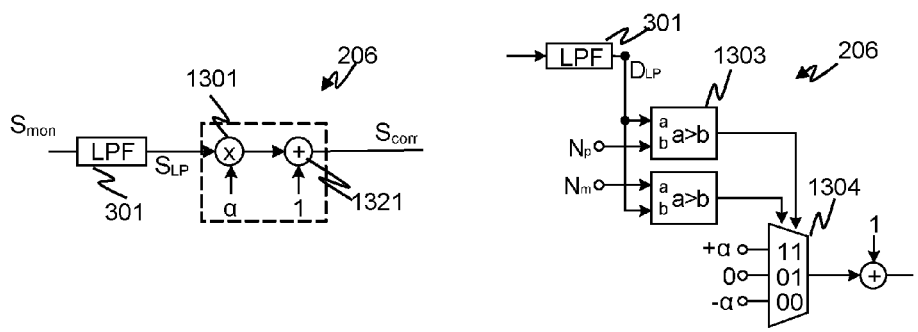
Figure 13a
Figure 13b

SIGNAL PROCESSING FOR MEMS CAPACITIVE TRANSDUCERS

This application relates to signal processing circuits for processing signals detected by transducers, especially MEMS capacitive transducers, and especially to read-out circuits for such transducers, in particular for MEMS microphones.

MEMS capacitive transducers, such as MEMS microphones, typically consist of two planar electrodes, with one of the electrodes being flexible and movable with respect to the other electrode. The flexible electrode moves in response to an incident stimulus, e.g. acoustic pressure, thus altering the distance between the plates from a quiescent value d to a value (d+x). For many MEMS microphones, the displacement x is, to a good approximation, linearly dependent on incident acoustic pressure within the normal operating range of the microphone.

As illustrated in FIG. 1a, to provide an electrical sense signal from a MEMS microphone 101, a bias voltage, for example 12V, is applied between the two plates. Typically one plate is directly coupled to a fixed high voltage $V_B$, with the other plate coupled, via a high bias impedance $R_G$ (typically of the order of gigaohms or so) to a bias voltage $V_G$ at or near ground. The microphone transducer capacitance $C_M$ is typically only 1 pf or so, and so the sense signal received at a node connected to the second plate requires local buffering. A signal processing or read-out circuit is thus provided to produce an output signal from the sense signal. In the example shown in FIG. 1a a voltage amplifier 102, with gain $A_v$, is arranged to generate a buffered voltage output signal Vout for transmission to downstream circuitry. The amplifier may include an ADC 103, so that the amplifier produces a digital output signal $S_{out}$.

In this example, the amplifier presents a high input impedance, so the charge $Q_M$ on the MEMS capacitance remains constant. The voltage is given by $Q_M/C_M$ and so is inversely proportional to the capacitance, which itself is inversely proportional to the plate separation, so overall the detected voltage is linearly dependent on the displacement.

For a typical sound level of 94 dBSPL, the linear displacement x is typically about 0.1% r.m.s. of the plate separation d. If the bias voltage between the plates is 12V say then the sensed voltage would around 12 mV r.m.s. With careful design, the audio-band input noise of the amplifier and bias arrangement can be of the order of 6 uVrms or less to give a signal-to-noise of 66 dB or better. This is acceptable for a range of applications.

However there is an increasing requirement to handle signals of greater amplitude, for example of the order of 140 dBSPL or more. Such an input sound level will lead to signals about 200 times larger than those discussed in the paragraph above, e.g. about 2.4V r.m.s.

Ensuring that the input stage of the amplifier is able to cope well with such a range of input voltage is a challenge. Also as mentioned above the bias impedance $R_G$ is typically of the order of tens of gigaohms. It is impractical to use normal integrated circuit materials to implement resistors of this magnitude. Commonly, therefore the bias impedance $R_G$ is implemented by diodes, particularly polysilicon diodes. These provide reasonably linear and high resistances for signal swings of tens or even hundreds of mV, but their impedance decreases exponentially with bias, so would clamp or clip audio frequency signals of higher amplitude.

One solution to these problems is to use a charge amplifier 104 to buffer the transducer signal as illustrated in FIG. 1b. This arrangement clamps the amplifier input voltage at the virtual earth of the amplifier. The voltage across the transducer 101 is thus maintained constant, but the change in capacitance $C_M$ resulting from an incident pressure stimulus causes a change in charge on the bottom plate. This is compensated by the op amp forcing the corresponding amount of charge on the feedback capacitor $C_F$ to maintain the virtual earth voltage. Thus there is little voltage across the bias impedance $R_G$, avoiding the problem of clamping or excess leakage discussed above in relation to diode-based $R_G$ implementations. Also the input voltage swing of the amplifier is also very small, so the input stage headroom is no longer an issue.

However it will be noted that in this arrangement there is no d.c. feedback across the op amp. Thus any d.c. offset, for example the input offset voltage of the op amp, will be amplified by the op amp open-loop d.c. gain and is thus likely to give a saturated output. To avoid this problem some additional d.c. bias stabilisation circuitry or d.c. servo (not shown for simplicity) is required, typically involving at least one of current injection into the virtual earth, modulation of the bias voltage applied to the non-inverting input or application of a signal to a secondary op amp input terminal based on low-frequency feedback from the op amp output or equivalent.

To avoid the complexity of this additional circuitry an alternative arrangement may be used as illustrated in FIG. 1c. In this arrangement a capacitor $C_{ATT}$, with a capacitance of say ten times the value of $C_M$, is placed to attenuate the signal input to the amplifier when large signal swings are detected. Regarding $C_{ATT}$ as part of the amplifier interface circuitry, the transfer function thereof is now dependent on both the voltage $V_M$ on the input and the charge $Q_M$ that has crossed the input boundary between $C_M$ and $C_{ATT}$. When the attenuation capacitor $C_{ATT}$ is connected the voltage swing across the bias circuitry $R_G$ is reduced by a factor of 10 or so. When only small input signals are present $C_{ATT}$ may be disconnected based on some control signal $M_{ATT}$ generated by signal level detection at some point downstream. Also illustrated in FIG. 1c are parasitic capacitances $CP_1$ and $CP_2$ internal and external to the amplifier circuitry, which also affect the transfer function in a similar but proportionately smaller manner than $C_{ATT}$.

The arrangements shown in FIGS. 1b and 1c thus address the issues of large input voltage swings. However for the charge amplifier arrangement shown in FIG. 1b, as the transducer voltage is now constant, and the charge $Q_M = C_M \cdot V_M$ is measured, the output signal is proportional to the transducer capacitance. The capacitance is inversely proportional to the separation between the plates. Thus the measurement signal is no longer proportional to displacement, nor thus to incident pressure.

Similarly, with respect to the circuit shown in FIG. 1c, when $C_{ATT}$ is say 10 times $C_M$, the transfer function is very similar to a charge amplifier, and similar distortion levels are seen for these high-amplitude signals.

Embodiments of the present invention thus aim to mitigate at least some of the above mentioned problems.

Thus according to the present invention there is provided a signal processing circuit for a MEMS capacitive transducer, the transducer producing, in use, a sense signal in response to an input stimulus, the signal processing circuit comprising:
  a signal path between an input for receiving said sense signal and an output for outputting an output signal based on said sense signal; and
  compensation circuitry configured to:

monitor the signal at a first point along the signal path and generate a correction signal; and modify the signal at at least a second point along said signal path based on said correction signal;

wherein said correction signal is generated as a function of the value of the signal at the first point along the signal path so as to introduce compensation components into the output signal that compensate for distortion components in the sense signal.

The first point in the signal path may be after the second point in the signal path.

In some embodiments there may be an analogue-to-digital converter located in the signal path. In such case the compensation circuitry may modify the signal within, or at the input to, the analogue-to-digital converter.

The compensation circuitry may be configured to modify the signal at the second point by adding the correction signal to the signal at the second point. Where an additive correction signal is used the correction signal may be generated to comprise at least one harmonic component generated from any fundamental signal component at said first point. The compensation circuitry may thus comprise a harmonic generation circuit for generating said correction signal based on the signal at said first point. The correction signal may be generated as a function of the square of the value of the signal at said first point and said compensation circuitry comprises squaring circuitry for producing said correction signal. Alternatively the correction signal may be generated as a function of the absolute value of the signal at said first point and the compensation circuitry may comprise rectification circuitry for producing the correction signal. In some embodiments the correction signal may be generated as a function of the value of the monitored signal relative to one or more thresholds and the compensation circuitry may comprise at least one comparator configured to compare a signal based on the signal at the first point with said one or more thresholds and generate the correction signal having a selected one of a plurality of predefined values based on said comparison. There may therefore be at least one multiplexor having predefined correction values as inputs wherein the multiplexor is configured to be controlled by the output of said at least one comparator.

The correction signal may be added to an analogue part of the signal path.

In some embodiments there may be at least a first analogue amplifier stage located in the analogue part of the signal path and the said second point is the input to said first analogue amplifier stage. The first analogue amplifier stage may be an input amplifier stage for receiving the sense signal from the MEMS transducer. Alternatively the first analogue amplifier stage may a subsequent amplifier stage to the input amplifier stage.

Where the signal processing circuit comprises an analogue-to-digital converter the second point in the signal path may be the input to the analogue-to-digital converter. In some embodiments however the second point in the signal path is downstream of the analogue-to-digital converter in a digital part of the signal path.

In some embodiments the compensation circuitry modifies the signal by modulating the gain of at least one component in the signal path based on the correction signal, for example to scale the value of the signal at the second point. The correction signal may be generated so as to scale the gain in accordance with a value proportional to $(1+\alpha \cdot V_s)$ where $\alpha$ is a predetermined value and $V_s$ is the value of the signal at the first point. The correction signal may be generated as a function of the value of the monitored signal relative to one or more thresholds.

The compensation circuitry may modulate the gain of a first analogue amplifier stage, which may be an input amplifier stage for receiving the sense signal from the MEMS transducer or a subsequent amplifier stage.

The compensation circuitry may modulate the gain of an analogue-to-digital converter and/or a digital gain element wherein the compensation circuitry modulates the gain of the digital gain element.

In some embodiments the first point in the signal path may be before the second point in the signal path.

The signal path may comprise a charge amplifier arranged as an input amplifier stage to receive the sense signal.

The compensation circuitry may comprise a low pass filter for producing a filtered version of the signal at the first point in the signal path. The filtered version of the signal at the first point in the signal path may be provided as a separate output of the compensation circuitry in addition to the correction signal.

The signal path may comprise an amplifier and the circuit may further comprise attenuation circuitry for applying a selectively variable attenuation to the sense signal to be amplified. The compensation circuitry may then be further configured to modify the signal at a point in the signal path downstream of the input to the amplifier to compensate for attenuation applied by said attenuation circuitry. The compensation circuitry may be configured to modulate the gain of at least one element in the signal path downstream of the input to the amplifier.

The signal processing circuit of embodiments of the present invention may comprise a read-out circuit for the MEMS capacitive transducer.

The compensation circuitry may be responsive to at least one stored setting value to define said function for generating the correction signal and the circuit may comprise a programmable element for storing at least one said stored setting value. The programmable element may be configured to store a setting value programmed during assembly of a host device incorporating said signal processing circuit. The programmable element may be reconfigurable. The programmable element may be configured to store a setting determined during a calibration step of a host device incorporating said signal processing circuit.

The signal processing circuit may be implemented as an integrated circuit. The integrated circuit may be connected to the MEMS capacitive transducer, e.g. via suitable bond wire or the like, or the MEMS capacitive transducer may be part of the integrated circuit. The MEMS capacitive transducer is a MEMS microphone.

Aspects of the invention also apply to an electronic device comprising a signal processing circuit as described above. The electronic device could be at least one of: a portable device, a battery powered device, a computing device, a communications device; a gaming device; a mobile telephone; a laptop computer; and a tablet computer.

In another aspect of the invention there is provided a method of compensating for distortion in a sense signal produced by a MEMS capacitive transducer, the method comprising:

monitoring a signal at a first point along a signal path between an input for receiving said sense signal and an output for outputting an output signal based on said sense signal;

generating a correction signal; and modifying the signal at at least a second point along said signal path based on said correction signal;

wherein said correction signal is generated as a function of the value of the signal at the first point along the signal path so as to introduce compensation components into the output signal that compensate for distortion components in the sense signal.

The method may be performed in any of the ways described above in relation to the first aspect of the invention.

In another aspect there is provided a signal processing circuit for a transducer, the transducer producing, in use, a sense signal in response to an input stimulus, the signal processing circuit comprising:
a signal path between an input for receiving said sense signal and an output for outputting an output signal based on said sense signal; and
compensation circuitry for monitoring the signal at a first point along the signal path and modifying the signal at at least a second point along said signal path;
wherein said compensation circuitry is configured to modify the signal at the second point as a function of the value of the signal at the first point so as to introduce compensation components into the output signal that compensate for distortion components in the sense signal.

In a further aspect there is provided a signal processing circuit for reducing distortion in an electrical sense signal produced by a transducer, the signal processing circuit comprising:
a signal path between an input for receiving said sense signal and an output for outputting an output signal based on said sense signal; and
compensation circuitry for generating a correction signal as a function of the instantaneous value of the signal present at a first point along said signal path and for combining the correction signal with the signal present at a second point along said signal path:

In a yet further aspect of the invention there is provided a signal processing circuit for reducing distortion in an electrical sense signal produced by a transducer, the signal processing circuit comprising:
an analogue-to-digital converter for receiving the electric sense signal; and
compensation circuitry for adding a correction signal to said electrical sense signal at the input of the analogue-to-digital converter and generating said correction signal from a digital output of the analogue-to-digital converter according to a non-linear transfer function defined to cancel anticipated distortion components of said electrical sense signal.

In another aspect of the invention there is provided a signal processing circuit for a transducer, the transducer producing, in use, a sense signal in response to an input stimulus, the signal processing circuit comprising: compensation circuitry for applying a correction to the sense signal, wherein said correction is based on an inverse of distortion components in a transfer characteristic between the input stimulus and the sense signal.

In a further aspect of the invention there is provided a signal processing circuit for a transducer, the transducer producing, in use, a sense signal, the signal processing circuit comprising:
a signal path between an input for receiving said sense signal and an output for outputting an output signal based on said sense signal;
an amplifier located in said signal path for amplifying said sense signal;
a selective attenuator coupled between said input and said amplifier for attenuating the sense signal to be amplified in response to a first control signal;
control circuitry configured to monitor the signal at a first point along the signal path and to generate said first control signal based on the signal level at said first point;
wherein said control circuitry is further configured to generate a gain control signal for applying a gain modulation to at least one component in the signal path, wherein said gain control signal is synchronised with said first control signal such that said gain modulation compensates for the attenuation of the sense signal.

The control circuitry may be configured to derive a monitored signal from the signal at a first point along the signal path and apply pre-emphasis filtering to the monitored signal The least one component to which a gain modulation is applied may be an analogue-to-digital converter. The analogue-to-digital converter my operable in different modes dependent on the magnitude of the signal input to the analogue-to-digital converter.

In these further aspects of the invention the transducer may be a MEMS transducer and/or a capacitive transducer and in particular a MEMS capacitive transducer.

The invention will now be described by way of example only with respect to the following drawings, of which:

FIGS. 12a and 12b illustrate embodiments for adding a correction signal to the input of the input amplifier stage;

FIGS. 13a and 13b illustrate embodiments of compensation circuitry for generating a multiplicative or gain modulation correction signal;

As mentioned above in relation to FIG. 1a the use of a voltage amplifier arrangement for buffering the sense signal from a MEMS transducer able to cope with a range of sound pressure levels creates challenges in terms of providing an amplifier of sufficient input voltage range. Also the diodes typically used as the bias impedance have an impedance that varies with bias and may clamp or clip the signal at high sense signal levels.

Figure 1A:
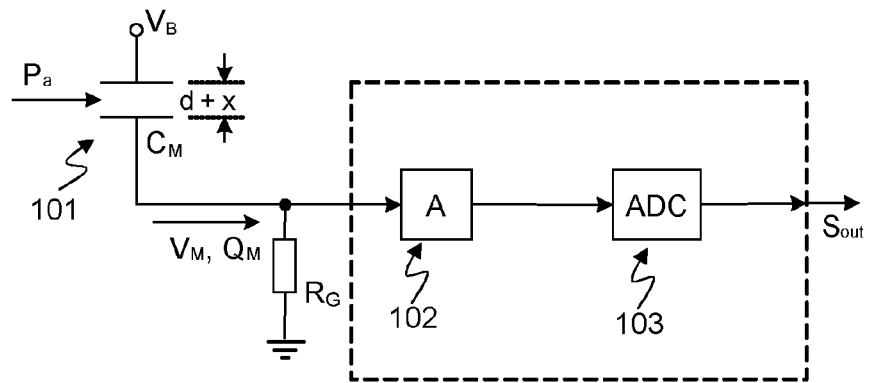
FIGS. 1a-1c illustrate known read-out arrangements for MEMS capacitive transducers.
Figure 1B:
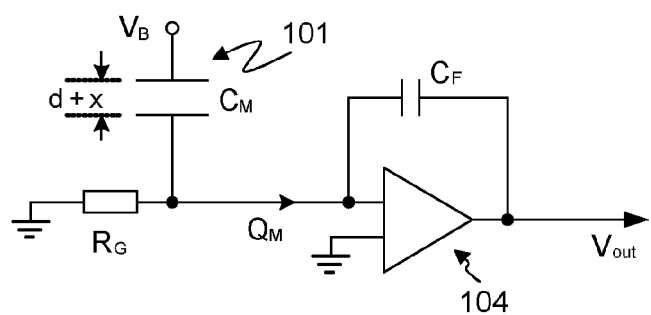

To address this problem it is known to use a charge amplifier arrangement such as shown in FIG. 1b, along with circuitry to provide dc stabilisation. With a charge amplifier arrangement however the sense signal is no longer linear with respect to input sound pressure.

For a MEMS microphone with electrodes of area A, the capacitance $C_M$ is given by $$C_M = \epsilon A/(d+x). \quad \text{(Eqn. 1)}$$

Steady state, assuming $V_G=0$ for simplicity, the charge $Q_M$ on the microphone is thus given by $$Q_M = V_B \cdot C_M = V_B \cdot \epsilon A/d. \quad \text{(Eqn. 2)}$$

For a voltage amplifier as shown in FIG. 1a this charge remains constant and thus the voltage across the capacitor $V_C$ is given by $$V_C = Q_M/C_M = V_B \cdot (d+x)/d. \quad \text{(Eqn. 3)}$$

It will be clear that the voltage swings detected are thus linear with respect to the displacement x.

However for the charge amplifier of FIG. 1b the voltage remains constant and the instantaneous charge on the bottom plate of the capacitor $Q_M$ is given by $$Q_M = V_B \cdot \epsilon A/(d+x) \quad \text{(Eqn. 4).}$$

It will be appreciated therefore that sense signal is inversely proportional to the displacement between the plates of the MEMS capacitive transducer. A displacement from the quiescent position d to a position d+x results in a change in charge of $$V_B \cdot \epsilon A \cdot \{1/(d+x) - 1/d\} = -\{V_B \cdot \epsilon A/d\} \cdot \{1 - 1/(1+x/d)\}. \quad \text{(Eqn. 5)}$$

Thus the sense signal is non-linear with respect to the linear displacement x. This leads to a distortion in the output signal that depends on the magnitude of the displacement x and also the sign of the displacement (i.e. whether the displacement is positive—moving the capacitor plates further apart than their quiescent separation—or negative—moving the capacitor plates closer together).

Figure 1C:
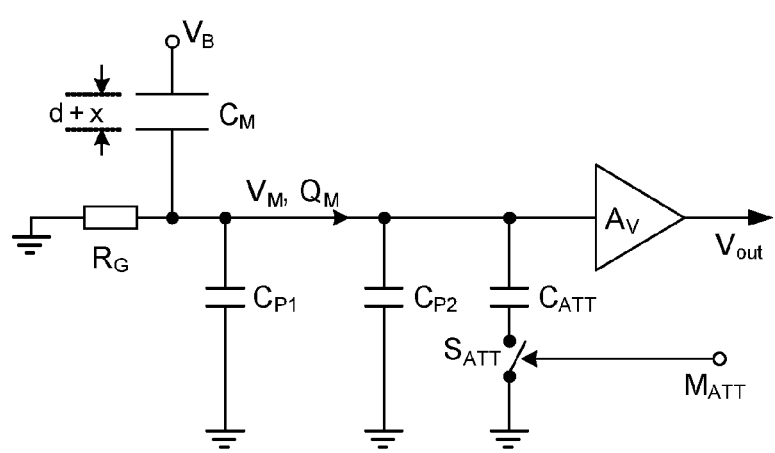

In the arrangement shown in FIG. 1c, when the attenuation capacitor is connected, the transfer function is very similar to a charge amplifier, and similar distortion levels are seen. Further clearly connecting and disconnecting the attenuation capacitor results in a step change in gain of the signal processing circuit, which clearly needs to be addressed in the downstream processing.

Embodiments of the present invention are therefore concerned with providing signal processing circuits for receiving a sense signal from a transducer, especially a MEMS capacitive transducer and produce an output signal that addresses the issues of non-linearity in the sense signal. Embodiments of the present invention therefore provide compensation circuitry which monitors the signal at a point along the signal processing path and which modifies the signal to at least partly compensate for any such non-linearity in the sense signal, i.e. to compensate for distortion components in the sense signal (with respect to the input stimulus). In essence the compensation circuitry introduces distortion components at at least one point along the signal path to compensate for inherent distortion components in the sense signal. The compensation circuitry generates a correction signal as a function of the value of the monitored signal and modifies the signal in the signal path based on the correction signal. In use the correction signal is generated as a function of the monitored signal value based on the determined or anticipated distortion components and effectively combined with the sense signal to at least partly compensate for such distortion components.

Figure 2:
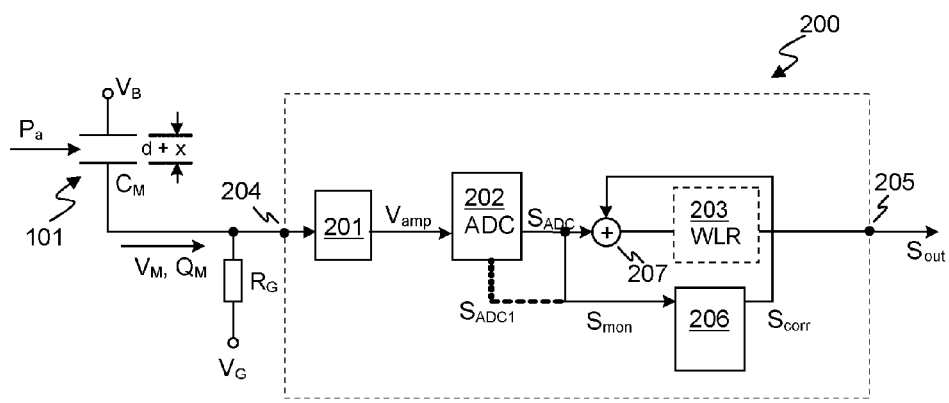
FIG. 2 illustrates an embodiment of a signal processing circuit having compensation circuitry according to an embodiment of the present invention.

FIG. 2 shows an embodiment according to the present invention. FIG. 2 shows a signal processing circuit 200 arranged to receive a sense signal from a capacitive transducer 101 biased between a high bias voltage $V_B$ and, via bias impedance $R_G$, a low bias voltage $V_G$ as described previously. The low bias voltage $V_G$ may nominally be ground or some other convenient fixed voltage. Alternatively, especially for charge amplifiers as discussed above it may be generated from circuitry providing low-frequency feedback from some point along the signal chain to regulate the quiescent operating point as is known in the art.

The sense signal from the MEMS transducer is input to an amplifier input stage 201. The amplifier input stage 201 may be arranged as a charge amplifier as discussed above. The output $V_{amp}$ from the amplifier stage 201 is passed to an ADC 202 which produces a digital version $S_{ADC}$ of the sense signal. In some instances, where a delta-sigma type digital output is required for instance, there may be a word length reduction (WLR) circuit 203 to reduce the word length as is known in the art.

The signal processing circuit thus has an input for receiving the sense signal, e.g. input node 204 (although the connection preceding $R_G$ to the MEMS transducer could be seen as the input in some embodiments) and an output for outputting an output signal $S_{OUT}$ based on the sense signal, e.g. output node 205. Located in the signal path between the input node 204 and the output node 205 are the amplifier stage 201 and ADC 202. A further circuit block 203 for example for word-length reduction from a multi-bit format to a single-bit format or conversely decimation circuitry for providing a higher-resolution lower-sample-rate format may also be present in the signal chain.

In this embodiment there is also compensation circuitry as noted above. In this embodiment the compensation circuitry comprises compensation control circuitry 206 for monitoring the signal at a first point along the signal path to generate an appropriate correction signal as a function of the value of the monitored signal and also modification circuitry 207 for modifying the signal at a second point along the signal path. In this example the compensation control circuitry 206 receives a digital signal $S_{mon}$ output from the ADC. As illustrated in FIG. 2 the digital signal monitored may be the signal $S_{ADC}$ tapped from a first point in the signal path downstream of the ADC or alternatively a digital signal $S_{ADC1}$ may be passed directly from within the ADC 202 to the compensation control circuitry 206, i.e. the first point at which the signal is monitored may be at a node within the ADC in the signal path.

In this embodiment the signal, $S_{mon}$, monitored by the compensation control circuitry 206 is thus a digital version of the sense signal and the compensation control circuitry 206 determines an appropriate digital correction value, $S_{corr}$. This digital correction value $S_{corr}$ is used to modify, in this particular example, the digital signal $S_{ADC}$ at, at least, a second point along the signal path to provide the output signal $S_{out}$. In this embodiment the digital correction value, $S_{corr}$, is added to the digital signal output $S_{ADC}$ from the ADC, in this example downstream of the first point at which the signal is monitored. Thus the digital correction value $S_{corr}$ is added to the digital signal $S_{ADC}$ by adder 207. Note for the avoidance of doubt the terms "adding", "added", "add" or "addition" as used herein shall respectively include "subtracting", "subtracted", "subtract" or "subtraction" and the adder 207 may thus subtract from the digital output signal $S_{ADC}$.

There are various ways in which a suitable non-linear correction signal may be generated as a function of the monitored signal value. For instance the compensation control circuitry 206 may comprise a harmonic generation circuit for generating harmonics of the sensed signal.

In a relatively simple implementation the instantaneous value of the monitored sense signal, $S_{mon}$, may be squared and used as the basis for the correction value. Note as used herein the sense signal will be taken to be the sensed change in electrical properties that is detected. In other words the sense signal will be taken as having a quiescent value of zero and can have positive and negative values, in other words any non-zero quiescent bias is disregarded for simplicity in this description.

As described above in relation to Equation 5 the operation of the charge amplifier may lead to a sense signal having a distortion or error which increases with the magnitude of linear displacement x. The action of the distortion is always to make the sense signal less positive (or more negative) than the ideal response. In other words, increasing positive values of linear displacement, i.e. increasing the separation of plates from the quiescent position, leads to the sense signal getting progressively lower than the ideal signal. However increasing the negative value of x, i.e. bringing the plates closer together than at equilibrium leads to an increasingly higher than desired sense signal. It will also be appreciated that the amount of distortion for a given magnitude of x is greater for a negative displacement than a positive displacement. In other words the transducer arrangement has a transfer function between input stimulus and sense signal value that includes distortion components.

Adding a correction value based on the square of the instantaneous signal value will result in an error correction that: (i) increases with the value of the signal; (ii) is positive (whatever the value of the instantaneous signal value) so makes the sense signal more positive (or less negative) than it would have been; and (iii) will provide greater correction for higher value signals thus correcting for the fact that a negative peak of the sense signal will appear to be a greater magnitude than the corresponding positive peak for an input stimulus of a fixed magnitude. Thus the correction signal may be determined as a function of the square of the value of the monitored signal value and such a correction signal will at least partly compensate for the distortion components introduced by the transducer transfer function.

Figure 3:
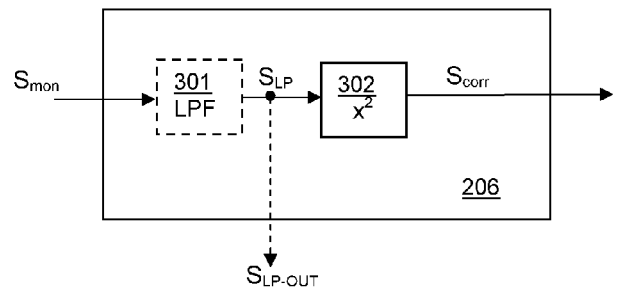
FIG. 3 illustrates one example of suitable compensation circuitry.

FIG. 3 illustrates one example of possible compensation control circuitry 206. In the embodiment shown in FIG. 3 the digital monitored signal, $S_{mon}$, is received and input to a low pass filter (LPF) 301. The ADC 202 may produce an oversampled output of only a few bits resolution, e.g. 1 bit or less than 8 bits for example. In the event that the ADC 202 does produce an oversampled output, the monitored digital signal $S_{mon}$ may need low-pass filtering to increase the word length to give reasonable resolution. In other words the low pass filter 301 may be provided to filter out high-frequency quantisation noise, before this has a chance to get mixed down in the subsequent non-linear operations carried out in the signal path by the compensation circuitry. The bandwidth of the filter 301 may thus be set to attenuate quantisation noise. However if the filter is, as shown, only present within the compensation control circuitry, then since in many cases the following stages of the compensation control circuitry (e.g. block 302) will attenuate the output of filter 301, thus attenuating any quantisation noise present in this signal before addition to the ADC output, the signal-to-noise requirements at the output of filter 301 may not be as strict as would be required for the main signal path, and therefore relatively simple filter arrangements may be used. The filter 301 may just remove ultrasonic components (>20 kHz) and have little effect in the audio band (20 Hz-20 kHz). In some embodiments however filter 301 may not be required and/or there may be a low pass filter already located in the main digital signal path and the signal may be monitored downstream of such a signal path filter.

The output $S_{LP}$ from the filter 301 (if present) may then be input to a non-linear harmonic generation circuit 302, in this instance a squarer ($x^2$). The present signal value is squared, for instance by using a multiplier to multiply the signal by itself. This squared value may be used directly as the correction signal $S_{corr}$. In some embodiments however this initial value of the correction signal could be subject to a linear scaling factor to provide the appropriate magnitude of correction signal $S_{corr}$. In any event the correction signal $S_{corr}$ can then be passed to the adder 207.

Figure 4A:
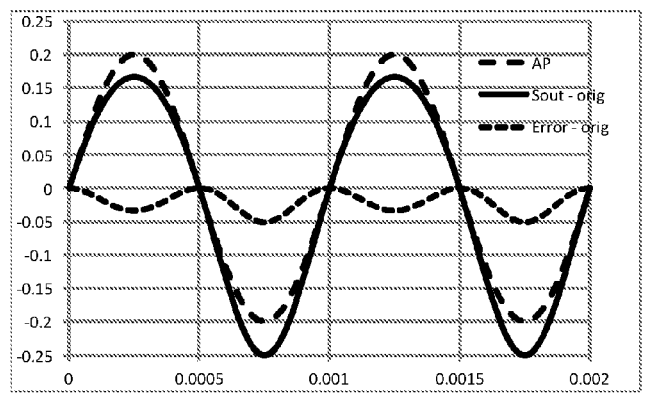
FIGS. 4a and 4b illustrate example waveforms for the circuit shown in FIG. 2 using the compensation circuitry of FIG. 3.
Figure 4B:
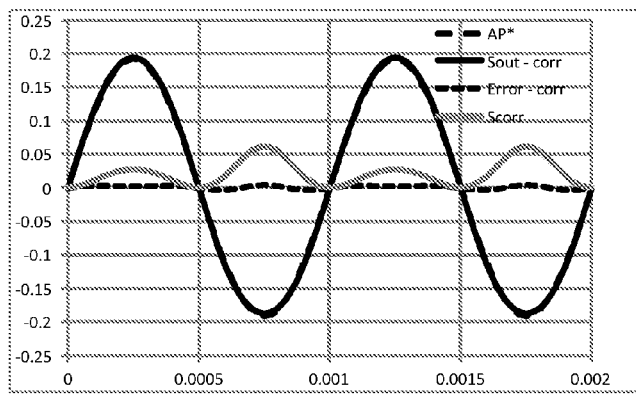

FIGS. 4a and 4b illustrates some example simulated waveforms for the signal processing circuit of FIG. 2 using the compensation circuitry of FIG. 3. The waveforms of FIG. 4 were calculated assuming that the amplifier 201 of FIG. 2 is a charge amplifier and an input sinusoidal pressure stimulus was applied causing a sinusoidal linear displacement of the plates of the capacitive transducer with a maximum displacement x equal to 20% of the quiescent plate separation d.

FIG. 4a illustrates the input sinusoidal pressure wave AP (scaled in terms of x/d) and the corresponding output signal, Sout-orig that would be produced by the charge amplifier in the absence of any compensation (scaled in a similar fashion). FIG. 4a also shows the error or distortion, Error-orig, in the output signal compared to the pressure input. This error signal is noticeably dominated by the second harmonic of the output signal and, as mentioned above, acts so to make the output signal less positive/more negative than the ideal response.

FIG. 4b illustrates the correction value signal $S_{corr}$ which is the original output signal, Sout-orig, squared (with no further scaling in this example). FIG. 4b also shows the resulting corrected output signal Sout-corr and the remaining error between AP* (waveform AP less a 4% gain adjustment to optimise the fit) and Sout-corr. It can be seen that the error signal is much reduced compared to the original error and the corrected output signal corresponds much more closely to the input signal. The small gain error may be corrected for or ignored.

It will therefore be clear that by monitoring the signal at a first point along the signal path, the compensation control circuitry 206 can derive a suitable compensation signal applied by modification circuitry 207 to compensate for the inherent distortion components in the sense signal.

In this example the compensation control circuitry 206 monitors the signal at a first point, i.e. first node, in the digital part of the signal path and supplies a feed-forward digital correction signal which is added to the signal at a second point, i.e. second node, in the signal path, which is also in the digital part of the signal path and downstream of the first point. However various other arrangements are possible.

For instance a feedback arrangement may be used where the first point at which the signal is monitored is downstream of the second point where the signal is modified. In such an implementation the compensation circuitry thus monitors the signal after at least some correction has already been applied. The level of correction which has already been applied could be taken into account, if necessary, when determining a suitable correction value.

In some embodiments the signal may be modified at two or more points along the signal path to provide the desired correction. The two or more points at which the signal is modified may all be upstream or all downstream of the first point at which the signal is monitored or the signal may be modified both upstream and downstream of the first point.

The first point at which the signal is monitored may be part of the analogue part of the signal path. Whether the signal that is monitored is digital or analogue the signal may be modified in the digital part of the signal path and/or in the analogue part of the signal path.

The sense signal may be modified by adding a correction signal at the second point as described above. In which case the compensation control circuitry may generate a non-linear correction signal and may for instance comprise a harmonic generation circuit.

Additionally or alternatively however the signal may be modified by applying a signal-dependent scaling or multiplication to the signal, for instance by modulating the gain of a variable gain element in the signal path according to a correction signal derived from the monitored signal.

Figure 5A:
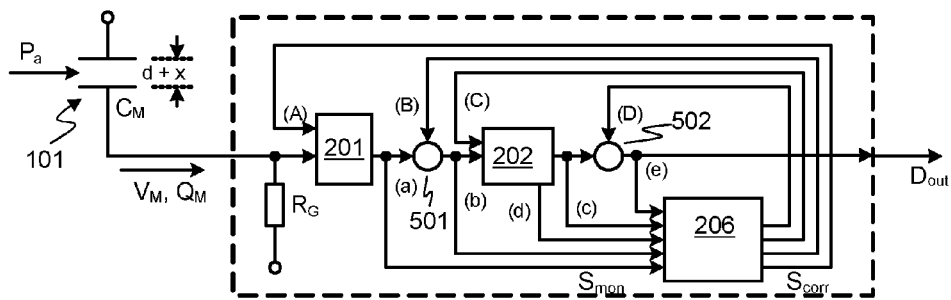
FIG. 5a illustrates generally various embodiments of the present invention and FIGS. 5b to 5e illustrate various ways in which the signal modification may be applied.

FIG. 5a illustrates a range of possibilities for monitoring the signal along the signal path and also for modifying the signal to apply the desired correction. FIG. 5a shows a signal path comprising an amplifier stage 201 and an ADC 202 as described previously. In some embodiments however the ADC 202 may be omitted and the signal processing circuit may output an analogue output signal. There may also optionally be at least one additional element 501 in the analogue path between the amplifier stage 201 and ADC 202. For example there may be additional amplifier stages or other gain stages or element 501 could be deliberately introduced to allow modification of the analogue signal. There may also be at least one element 502 in the digital part of the signal path downstream of the ADC 202, for instance a digital gain stage or other signal processing element, or element 502 could be deliberately introduced to allow modification of the digital signal. Elements 501 and/or 502 may therefore already be present in some conventional signal processing circuits for some other function or may have been deliberately added to allow for the compensation signal to be applied.

Compensation circuitry 206 is arranged to monitor the signal along the signal path at a first point and to apply a compensation signal to modify the signal at at least a second point.

As illustrated in FIG. 5a the signal at a first point along the signal path from the input to the output is monitored. The signal may be monitored at a range of different possible point along the signal path, for instance points:

(a) at the output of the first amplification/buffer stage 201;
(b) after a following gain stage 501;
(c) at the output of the ADC 202;
(d) from an auxiliary output of the ADC 202 (in some instances the ADC may already produce an auxiliary output which is used for example by overload detection circuitry or some other regulation circuitry for adjusting the operating parameters of the ADC. Even if no auxiliary output is required by the rest of the signal processing circuit using an auxiliary output of the ADC rather than the main signal path output may allow a different resolution output, higher or lower to be used by the compensation circuitry which may be beneficial to improve performance of the compensation circuitry or allow simpler circuitry to be used than otherwise would be the case); and/or
(e) at the output of a digital adder/multiplier, or possibly other post-ADC DSP function such as a filter.

The monitored signal $S_{mon}$ is input to compensation control circuitry 206 to generate a correction signal $S_{corr}$ for correcting or compensating for distortion in the sense signal generated by a MEMS capacitive transducer. $S_{corr}$ is used to modify the signal at at least a second point along the signal path. The non-linearity and/or scaling applied by $S_{corr}$ is designed to be such that $S_{corr}$ substantially cancels major distortion components of the signal to reduce the distortion observed in the output signal $S_{out}$.

The first point at which the signal is monitored may be either before or after the second point in the signal chain, where the correction is applied.

Figures 5B, 5C, 5D, 5E:
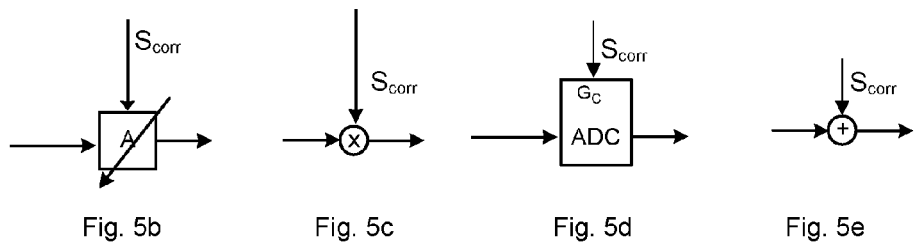

As mentioned the correction signal $S_{corr}$ may be used to modify the signal at a second point along the signal path. The signal may be modified at a number of different points by use of an additive correction signal for example. As illustrated in the FIG. 5a the correction signal may, for example, be:

A. added to the sense signal within the first stage of the amplifier 201, perhaps at an auxiliary input node (an example of which will be discussed in more detail below with reference to FIG. 12);
B. added to the analogue signal output from the amplifier 201 at element 501, which could for example be a subsequent amplifier or mixing stage (as generally represented in FIG. 5e, an example of which will be discussed in more detail below with reference to FIG. 12);
C. added into the input of the ADC 202 via an auxiliary ADC input path (an example of which will be discussed in more detail below with reference to FIG. 9); and/or
D. used to modify the digital signal by element 502, which may for example by a digital adder (as generally represented in FIG. 5e and discussed above in relation to FIG. 3).

As mentioned the signal at the second point along the signal path may additionally or alternatively be modified at a number of different points by use of a multiplicative correction signal. As illustrated in the FIG. 5a the correction signal may, for example, be:

A. used to modulate the gain of the initial amplifier stage (as illustrated in FIG. 5b), for example by digitally altering feedback resistor network resistance values (an example of which will be discussed in more detail below with reference to FIG. 16);
B. used to modulate the gain of such a subsequent amplifier stage (as generally illustrated in FIG. 5c, an example of which will be discussed in more detail below with reference to FIG. 15);
C. used to modulate the gain/sensitivity of the signal input of the ADC 202 (as illustrated in FIG. 5d), for example by altering the impedance of an ADC input path (for example by digitally altering input resistor resistance values or altering the switching of input switched capacitors—an example of which will be discussed below in relation to FIG. 15); and/or
D. used to modify the digital signal by element 502, which may for example by a digital multiplier (as illustrated in FIG. 5c).

In practice, to obtain adequate performance without undue hardware or processing effort, the signal is likely to be monitored only at one or two of the listed monitoring points. Likewise the signal may only be modified at one or two of said possible points in the signal path.

The signal $S_{mon}$ providing the monitoring of the signal at the first point in the signal path may therefore be analogue or digital. Likewise the correction signal $S_{corr}$ may also be analogue or digital.

If the monitoring and/or correction signals are digital they may have any appropriate resolution. For instance they may be one-bit or multi-bit, and may for example be in an low-resolution (say 8 bits or less) oversampled format such as delta-sigma or at higher resolution at a standard audio sample rate. For example standard audio rates may be. 48 kHz, 44.1 kHz, 16 kHz or 8 kHz and an oversampled rate could, for instance, be at least 768 kHz nominal. In some applications the sample rate could be some suitable multiple of a standard audio rate (i.e. less than 768 kHz nominal) with a relatively high resolution, for example greater than 10 bits.

If the monitoring and/or correction signals are analogue signals then they may be voltages or currents or a combination of both.

The correction signal generated and applied may be essentially continuous in amplitude or may be limited to a small set of discrete levels, i.e. sampled, for example to provide a more economic implementation.

As mentioned above the compensation control circuitry 206 may generate a correction signal $S_{corr}$ which is added to the signal at the second point along the signal path. Where the compensation control circuitry 206 generates an additive correction signal it may comprise harmonic generation circuitry. When generating an additive correction the compensation control circuitry may comprise, for example:
 i) a squaring circuit for producing a correction signal based on the square of the instantaneous value of the monitored signal $S_{mon}$, whether analogue or digital;
 ii) an absolute value or rectification circuit for producing a correction signal based on the rectified value or magnitude (but not sign) of the monitored signal $S_{mon}$;
 iii) a plurality of comparators comparing $S_{mon}$ to a set of threshold values, with or without hysteresis, providing logic levels from which a multi-level (possibly only two-level) piecewise constant correction is derived; and/or
 iv) a look-up table or equivalent encoding the desired non-linear transfer function.

It will be clear from the discussion above that the compensation circuitry may be implemented with the second point earlier in the signal path than the first point, i.e. in a feedback arrangement. It should be noted however that the compensation circuitry feedback arrangement is entirely different to (and generally separate from) an amplifier negative feedback loop that may conventionally be provided around a high gain amplifier for improving amplifier performance, e.g. to improve gain stability or amplifier linearity. In such an amplifier feedback arrangement the feedback is negative and typically the amplifier output is simply fed-back to the amplifier input, which may for instance be the inverting input of an op-amp. In such a conventional amplifier loop the feedback signal is thus just typically a linearly scaled or filtered version of the amplifier output signal and therefore can vary in polarity and has the same characteristics as the amplifier output. In many respects such an amplifier feedback loop can be seen as part of the amplifier circuitry.

The compensation circuitry of embodiments of the present invention is in addition to and different from any such amplifier feedback loops. The feedback signal generated by the compensation control circuitry is based on the monitored signal but is non-linear with respect to the monitored signal—for instance the polarity of the feedback signal may always be positive (for a signal which has a quiescent level at ground). The feedback signal generated by the compensation control circuitry will also generally have additional frequency components to that at the monitor point, and the loop gain of the compensation circuitry feedback loop will be low.

As also mentioned above the compensation control circuitry may additionally or alternatively generate a correction signal which is used to modulate the gain applied to the signal at some point along the signal path and the compensation circuitry may include modification circuitry for implementing said gain modulation. In other words the compensation control circuitry generates a multiplicative correction signal, which, when applied multiplicatively to the signal, cancels at least some distortion components of the signal.

Where the compensation control circuitry generates a multiplicative correction signal it may comprise gain factor modulation circuitry. When generating a multiplicative correction the compensation control circuitry may comprise, for example:
 i) a scaling circuit, whether analogue or digital;
 ii) a polynomial generation circuit, for example generating a first-order function of the type $1+\alpha \cdot S_{mon}$ or optionally higher-order functions;
 iii) a plurality of comparators comparing $S_{mon}$ to a set of threshold values, with or without hysteresis, providing logic levels from which a multi-level (possibly only two-level) piecewise constant correction is derived; and/or
 iv) a look-up table or equivalent encoding the desired non-linear transfer function.

It should be noted that the compensation circuitry gain modulation is entirely different to (and generally separate from) any other gain control that may be present in the signal processing path, for instance for automatic gain control of an amplifier or decompression. The compensation circuitry of embodiments of the present invention is in addition to and different from any such gain control and arranged to compensate for distortion components inherent in the sense signal due to the transfer function of the transducer.

In some instances at least one additive correction may be applied to the signal at one point along the signal path with a multiplicative correction also being applied, at the same or another point of the signal path.

Elements of the compensation control circuitry 206 and/or the modification circuitry may be physically located within other blocks of the signal processing circuit, for example a logic signal or signals may be generated which then alters clocks applied to a switched-capacitor input to the ADC. The compensation control circuitry 206 may thus generate an intermediate logic signal or signals which are then applied to components of elements in the signal path such as the ADC 202 or amplifier 201.

In embodiments of the present invention therefore a correction signal is generated as a function of the value of the monitored signal, i.e. the instantaneous value of the monitored signal. The correction signal is generated so that when combined with the sense signal, e.g. by addition or by a gain modulation/scaling, it (at least partly) compensates for distortion components present in the sense signal (due to the transfer function of the transducer and amplifier).

The relationship between the monitored signal value and the correction signal, i.e. the relevant function, may in some instances by hardwired based on the choice of compensation control circuitry and modification circuitry. For instance if the signal were monitored and modified in an analogue part of the signal path and the compensation control circuitry comprises an analogue squaring circuit for additive correction, the function defining the relationship between the monitored signal value and the correction signal may be hardwired by the chosen components. Such circuit components may be used for a particular transducer and amplifier arrangement based on expected or previously measured distortion for that arrangement, i.e. based on testing of other components.

In some embodiments at least some aspects of the relationship between the monitored signal value and the correction signal may be determined by various settings. For example, where the monitored signal is compared to threshold levels to output one of a plurality of correction signal values, the threshold levels and/or correction signal values may be determined by various circuit settings. For example the relevant threshold values could be stored in a memory, which may be one-time programmable (such as fuse array or the like or a reprogrammable memory) or set by a control register setting or the like. Likewise the various correction signal values may be set in a similar fashion. Indeed there may be a plurality of comparators and multiplexors allowing for up to n different threshold levels and correction values and the number of comparators used may be selected by an appropriate setting. Likewise co-efficient values for scaling the correction signal may be stored in memory or programmable elements. In some instances the memory or programmable element storing the settings may be located on a different integrated circuit to the signal processing circuit of the present invention. If necessary the relevant settings could be loaded into control registers of the signal processing circuit on device start-up or reset.

Any such correction settings could be set by the manufacturer of the signal processing circuit, for example based on expected distortion components for an intended transducer and amplifier arrangement (which may have been derived from testing other similar arrangements). Alternatively the settings could be programmed by a device manufacturer. In this case the settings could be based on a calibration performed using the actual transducer and amplifier arrangement, for instance a calibration step performed during device assembly. Such a calibration could comprise applying one or more known test stimuli to the transducer, either in the absence of any distortion compensation and/or with a particular set of compensation settings and determining appropriate final settings that can then be programmed.

In some embodiments at least some aspects of the function defining the relationship between the monitored signal value and correction signal may be reconfigurable in use, such as entries in a look-up table or the values of various coefficients used in generating the correction signal. In such embodiments the transfer function between the value of the monitored signal and the correction signal may be varied in use, for instance based on additional calibration data. The assembled device may have the ability to run a self calibration process, for instance on start-up or reset. For example the device may transmit a sound of constant (or known varying) acoustic intensity on start-up which can be detected by the transducer and used as a reference signal. The detected sense signal could then be analysed to determine what compensation settings need to be applied and/or whether any existing settings need to be adjusted.

Various advantageous embodiments of the invention will be described further below.

Figure 6:
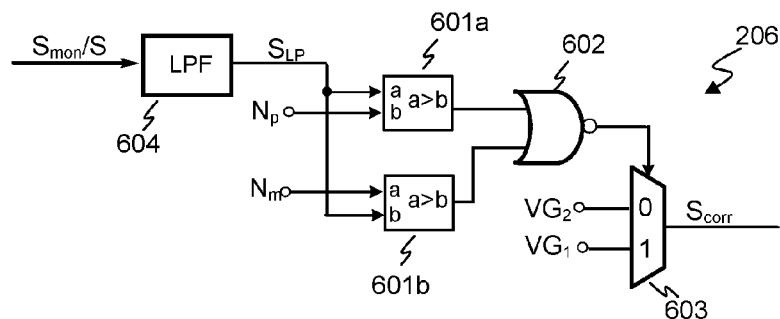
FIG. 6 illustrates another example of suitable compensation circuitry.

As mentioned above in some instances the compensation control circuitry may be arranged to compare the monitored signal $S_{mon}$ with one or more threshold levels to provide one or more correction signal values. FIG. 6 illustrates one example of suitable compensation control circuitry 206 that could, for example, be used in the arrangement shown in FIG. 2.

In the example shown in FIG. 6 the signal is monitored at a first point in the signal path and compared to various thresholds by comparators 601a, 601b. The monitored signal may be a digital signal as described previously. In this instance there are two comparators, a first comparator 601a for determining whether the signal is above a positive threshold $N_p$ and a second comparator 601b for determining whether the signal is below a negative threshold $N_m$ (which may have the same or a different magnitude to $N_p$). The output of the comparators 601a, 601b are passed to NOR gate 602 which controls multiplexor 603 so as to apply a selected correction signal value, $VG_1$ or $VG_2$. In this example if the monitored signal $S_{mon}$, or a derivative thereof, for example $S_{LP}$, lies between the two thresholds, and thus is neither above $N_p$ nor below $N_m$, a value of zero is used ($VG_1=0$) as the correction signal, i.e. no correction is applied. However, if the signal is above $N_p$ or below $N_m$ then a non-zero value $VG_2$ is used as the correction signal value.

The monitored signal $S_{mon}$ may be filtered in a low pass filter 604 to produce a signal $S_{LP}$ prior to the comparison as described above. The filter 604 may form part of the compensation control circuitry 206 as described above in relation to FIG. 3, in which case the input to the filter 604 is the monitored signal $S_{mon}$. However in some applications there may be a filter located in the signal path and the monitored signal may be the filtered digital signal $S_{LP}$ present in the signal path. In other embodiments there may no need for any filter 604.

Example waveforms were calculated for the circuit of FIG. 2, in the same way as discussed above in relation to FIG. 4, but using the compensation circuitry as shown in FIG. 6. FIG. 4a thus shows the input air pressure stimulus AP, the resulting uncorrected output signal (based on a sinusoidal linear displacement of the plates of the capacitive transducer with a maximum displacement x equal to 20% of the quiescent plate separation d) and the corresponding error.

Figure 7:
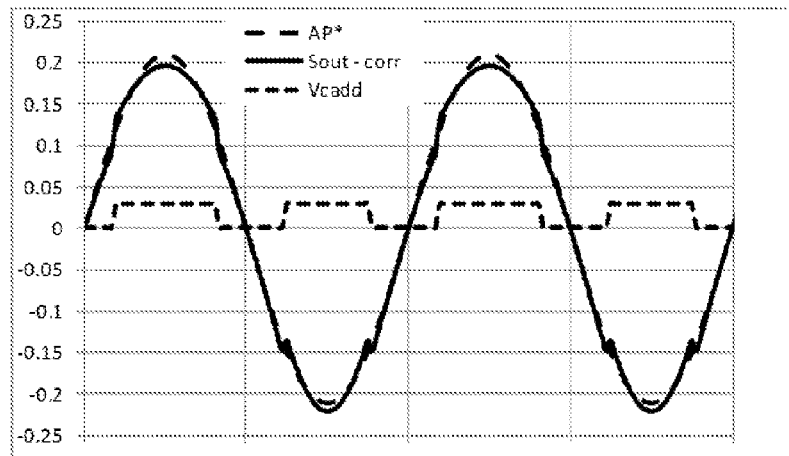
FIG. 7 illustrates example waveforms for the circuit shown in FIG. 2 using the compensation circuitry of FIG. 6.

FIG. 7 shows the acoustic pressure signal AP* (scaled from AP by 5% to fit the fundamental amplitude), the correction signal $S_{corr}$ applied and the corrected output signal. The positive threshold Np was set as 0.11, with the negative threshold Nm as −0.13. A correction value $VG_1$ of zero was applied when the signal is between the thresholds and a value $VG_2$ of 0.03 was applied when the signal is above the positive threshold or more negative than the negative threshold.

Despite the relatively crude nature of the correction, applying a two-level correction it can be seen that the corrected output signal is overall closer to the input stimulus than the uncorrected signal. The total harmonic distortion is reduced by about 6 dB using this arrangement.

The compensation circuitry 206 shown in FIG. 6 thus uses relatively simple components and avoids any relatively complex circuitry such as a squaring circuit or multiplier and yet still provides a significant reduction in distortion. Clearly the idea could be extended to more threshold levels with differing amounts of correction being applied as different thresholds are crossed.

As mentioned the monitored signal could be a digital signal but clearly the comparators $601a$, $601b$ could be voltage comparators for comparing an analogue signal with reference voltages. Additionally or alternatively the inputs to multiplexer 603 could be suitable voltage levels for adding to an analogue signal at a suitable summing node prior to any ADC. Further the arrangement in FIG. 6 provides the same correction value for signals above the positive threshold as it does for signals below the negative threshold. A multiplexor with three of more inputs could instead be used with a multi-bit control signal receiving signal direct from the comparators $601a$, $601b$ (i.e. omitting NOR gate 602) to provide different correction signals for the various bands defined by the threshold levels.

FIGS. $8a$ and $8b$ illustrate some other examples of possible compensation control circuitry. In the embodiment shown in FIG. $8a$ the signal may be passed through a high pass filter (HPF) 801 to remove d.c. offset or drift, for example due to constant or varying leakage associated with the MEMS sensor, so as to allow more accurate processing. High pass filtering may also be desirable to avoid wander in the output signal d.c. level. The high pass filter 801 may therefore be located in the signal path. There may also be a low pass filter (LPF) 802 as described previously. The compensation control circuitry 206 comprises a non-linear functional block 803 which in this example is an "absolute", i.e. ABS, function outputting the absolute value or magnitude of the monitored signal, i.e. performing rectification. Such an ABS function is very simple to implement digitally, e.g. by circuitry that drops the sign bit from the monitored signal. Such a correction signal again clearly increases with the absolute value of the signal and results in a correction that makes the output signal more positive/less negative than it would otherwise have been. Optionally the ABS value may be scaled if necessary by a scaling factor $\alpha$, for example using a simple multiplicand to reduce complexity, in a digital multiplier 804. If necessary this ABS value, scaled if required, may be applied to a word length reduction (WLR) block 805 to reduce the width of the digital output. The ABS function provides a non-linear correction as the sign of the correction value is the same, whatever the sign of the actual signal.

FIG. $8b$ shows a similar arrangement but in this embodiment the ABS output from the non-linear circuitry 803 is input to a comparator 806 and compared with a single reference $N_p$ to generate a 1 bit signal indicating whether the signal magnitude is above or below the threshold. In some embodiments this may be used as the basis of the correction signal but in the embodiment shown in FIG. $8b$ it is used to control multiplexor 807 in a manner similar to that discussed above in relation to FIG. 6. Clearly a range of comparators and threshold levels could be used if desired.

Referring back to FIG. 2, the circuit arrangement shown is a feed-forward arrangement where the first point where the signal is modified is upstream of the second point where the signal is modified. As mentioned above though the compensation circuitry may be arranged in a feed-back embodiment where the first point, where the signal is monitored, is downstream of the second point where the signal is modified. If the signal is both monitored and modified in the digital part of the signal path, for example by monitoring the signal at point (e) shown in FIG. 5 and adding a correction signal to a digital adder 502, then either of the embodiments shown in FIG. 3 or 6 may be used as the compensation circuitry.

Referring back to FIG. 3 the monitored signal $S_{mon}$ may therefore be the signal which has been modified using the correction signal $S_{corr}$. In the example of FIG. 3, where $S_{corr}$ is based on the square of the monitored signal and added to the sense signal, the value of $S_{corr}$ is thus derived from a monitored signal $S_{mon}$ which already comprises some components which are based on the square of the instantaneous value of the original sense signal. Thus $S_{corr}$ (and $S_{mon}$) will also contain higher order components of polynomial expansion. This results in a slight change in the resulting correction applied but the change is not significant—the correction applied will still vary with the instantaneous magnitude of the signal and act to make the output signal $S_{out}$ more positive/less negative than it would have been. In the frequency domain the correction signal $S_{corr}$ will comprise other even order harmonics in addition to the second harmonic.

It will be noted that in this arrangement, where the monitored signal $S_{mon}$ is digital, the filtered signal $S_{LP}$ is thus a filtered digital version of the ADC output signal $S_{ADC}$. Such a filtered signal $S_{LP}$ may be useful for other aspects of the signal processing and thus optionally this signal may also be provided as a separate output, $S_{LP\text{-}OUT}$, for use in other parts of the circuit, possibly after passing through a word length reduction (WLR) block. Thus if a low pass filter (LPF) is provided as part of the compensation control circuitry 206 then, in such a feed-back arrangement, a higher-resolution digital version of the output signal may be produced that may be useful for a range of other functions, such a overload detection, volume control or automatic gain control (AGC).

Referring back to FIG. 6 in a feedback arrangement the signal compared with the thresholds will be the modified signal, i.e. $S_{mon}$ will be the signal to which $VG_1$ or $VG_2$ has been applied. The thresholds and correction value $VG_2$ may therefore be adjusted accordingly but again using the modified signal does not impact significantly on the operation of the compensation circuitry and the advantages thereof.

Likewise the compensation control circuitry embodiments illustrated in FIGS. $8a$ and $8b$ could equally operate using the modified signal as the monitored signal $S_{mon}$.

It will be noted that if there is already a low pass filter present in the signal path to meet some requirement, then the compensation circuitry may be implemented with only a few extra simple components and the distortion compensation benefits can be easily provided.

As mentioned above the signal modification may be applied by adding a correction signal to a node in the analogue part of the signal path. In a feedback arrangement the signal could be monitored in the digital part of the signal path and a suitable correction voltage developed which could be added to the analogue signal at a suitable summing node. The embodiments of the compensation control circuitry shown in FIGS. 3 and 6 could be used to generate an appropriate correction voltage by using a digital-to-analogue converter (DAC) at the output of the compensation control circuitry to generate a desired voltage level at a desired resolution. Alternatively for the embodiment of FIG. 6 the multiplexor 603 may be arranged to multiplex between two voltage levels.

Figure 9:
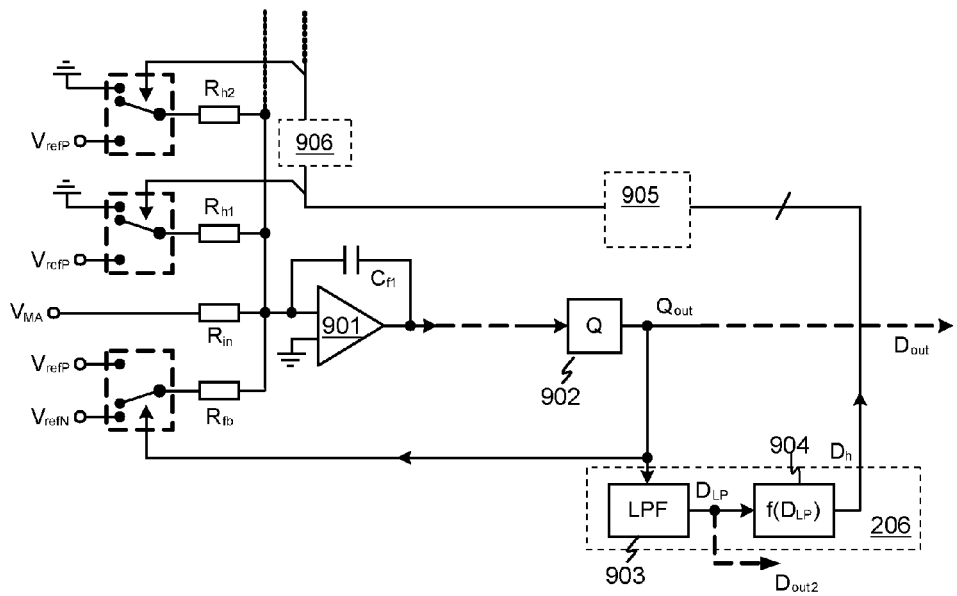
FIG. 9 illustrates one embodiment for adding a correction signal to an input of an ADC.

In some embodiments however a correction signal could be used to add to the signal input to the ADC 202. Thus the modifying circuitry which forms part of the compensation circuitry may form at least part of, or be arranged to modify the signal at, the input of the ADC. FIG. 9 illustrates the components of an ADC suitable for use as the ADC 202 of FIG. 2. Op-amp 901 together with capacitor $C_{f1}$ represent the input integrator stage of a delta-sigma modulator, which operates in conjunction with input resistance Rin and ADC feedback resistance $R_{fb}$ to integrate the low-frequency error between the input signal applied to $R_{in}$ and the derived delta-sigma coded waveform applied to $R_{fb}$. The output of op-amp 901 is coupled, possibly at least partly via further integrators (not shown for clarity) to an output quantizer 902. Each clock cycle, the output of the quantizer Q determines whether the feedback resistance $R_{fb}$ is to be connected to a relatively positive voltage reference, $V_{refP}$, or a relatively negative voltage reference, $V_{refN}$, to charge or discharge capacitor Cf1 in competition with the signal current injected via $R_{in}$, as will be understood by one skilled in the art. The high audio-frequency loop gain of the negative feedback loop comprising the integrator and the quantiser and the feedback path via $R_{fb}$ serves to minimise the audio-frequency error between the input signal and the derived delta-sigma coded waveform.

The delta-sigma stream thus provides a faithful reproduction of the signal input to the ADC. However as described previously this input signal contains non-linear components due to the non-linear transfer function of the transducer. To correct for these, compensation circuitry is added. The quantised output is thus received by compensation control circuitry 206 which may include a low pass filter 903 and non-linear generation circuitry 904, for example to apply a squaring function as discussed previously to generate a correction signal Dh for controlling modification circuitry including further integrator input resistors, $R_{h1}$, $R_{h2}$. The digital correction signal Dh is used to selectively switch these further integrator input resistors, $R_{h1}$, $R_{h2}$ to either ground or a reference voltage. If such a resistor is connected to the reference voltage it will add a component to the input signal dependent on the value of the resistance and the reference voltage. Two such resistors are shown in FIG. 9 to illustrate the principle, which could be selected by a 2 bit digital correction signal Dh, however they may be more resistors in other embodiments—or just one resistor if a two-level correction is sufficient. Where there are multiple resistors the values of the resistances and/or the reference voltages could be weighted, e.g. binary weighted. Dynamic error matching techniques may be used to reduce the effect of the likely manufacturing-induced mismatches. Alternatively a word length reduction (WLR) block 905 could be used, if necessary, to reduce the digital correction signal to a 1 bit output and delays 906 could be located between tap points for the resistors Rh so that this signal bit signal ripples along a delay line controlling the resistors. This produces a finite-impulse-response filter, and allows the use of a single bit data stream without excessive quantisation noise. Any resistor mismatch then only causes small deviations in the response of this low-pass filter, rather than quantisation noise.

In some embodiments switched capacitors may be used instead of resistors Rh. In such an embodiment the correction signal Dh may be combined with multiphase clocks to alter the switching sequence of the switched capacitors in some cycles to alter the effective input signal according to the correction signal.

As again the monitored signal is in effect the corrected signal the output of the low pass filter 903 may be separately output to be used for other processing.

Figure 10:
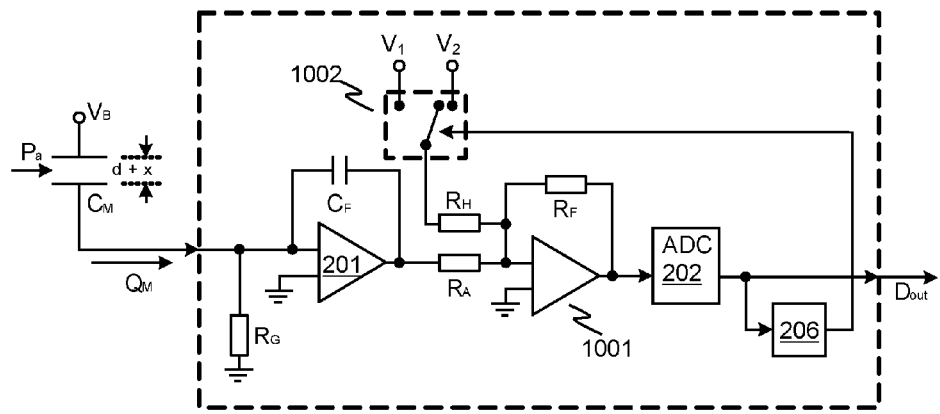
FIG. 10 illustrates one embodiment for adding a correction signal to a component in the analogue part of the signal path.

As mentioned above in relation to FIG. 5 the signal may in some instance be modified at a part of the analogue signal path between the first amplifier stage 201 and the ADC 202, i.e. at point B shown in FIG. 5. FIG. 10 illustrates one example of such an embodiment. The additive correction signal is, in this example, added to the analogue signal and presented to the ADC input by a separate amplifier stage. This separate amplifier stage has a conventional inverting op-amp 1001 and resistor summing circuit. In this embodiment the compensation control circuitry 206 monitors the digital signal output from the ADC but other arrangements are possible. The compensation control circuitry controls a switch 1002 which connects resistor $R_H$ to a selected one of a plurality of reference voltages, e.g. $V_1$, $V_2$. One reference voltage $V_1$ may be ground and may be selected when no addition is required. If connected to a non-zero reference voltage $V_2$ this will add a signal (weighted by the relative value of $R_H$ to $R_A$) to the signal path. FIG. 10 illustrates a single switch 1002 with two reference voltages $V_1$, $V_2$ but clearly more switches/reference voltages could be provided, possibly with appropriately weighted values of the resistance $R_H$. Alternatively, the compensation control circuitry could directly drive resistor $R_H$ with a desired driving voltage rather than control the switching between reference voltages. The required driving voltage could be obtained by a DAC acting on a digital output from the compensation control circuitry or the compensation control circuitry could output a desired voltage directly, for instance using the compensation control circuitry illustrated in FIG. 6 to multiplex between a range of different possible driving voltages. FIG. 10 illustrates the digital signal being monitored after being output from the ADC but clearly the digital signal could be monitored at different parts of the signal path or the signal could be monitored in the analogue part of the signal path (in which case the compensation loop may be wholly analogue).

Figure 11:
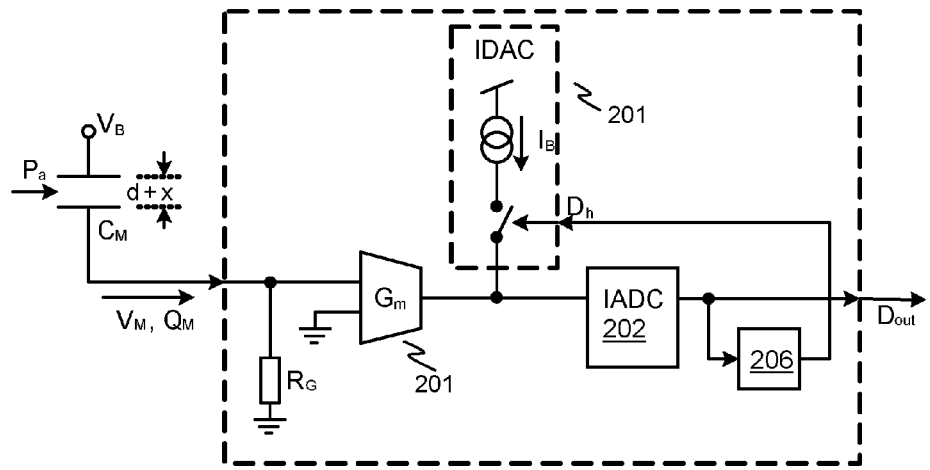
FIG. 11 illustrates one embodiment of a correction signal being added in the current domain.

FIG. 11 illustrates that the amplifier 201 may operate in the current domain and thus the additive correction signal may be applied in the current domain. In this example the input amplifier stage 201 is a (linear) transconductance stage and the DAC 202 may be a current ADC, for example a continuous-time current-input delta-sigma ADC (although the current signal could alternatively be converted to voltage via an appropriate input resistor and applied to a voltage-input ADC). The compensation control circuitry in this example controls a programmable current source 1101 such as a current DAC, which may be 1-bit or multi-bit.

As mentioned above in relation to FIG. 5 the signal may in some instance be modified at a part of the analogue signal path between at the input to first amplifier stage 201, i.e. at point A shown in FIG. 5. FIGS. 12a and 12b illustrate two examples of such embodiments. In the example shown in FIG. 12a the input stage 201 is non-inverting op-amp circuit with gain defined by feedback resistors $R_{F1}$ and $R_{F2}$. The compensation control circuitry 206 generates a correction current signal which is injected at some intermediate point between $R_{F1}$ and $R_{F2}$, e.g. a common node. In a simple example the compensation control circuitry switches in a current source 1201, for example based on a comparison of the signal level against one or more thresholds but in other embodiments the current source 1201 could be a programmable current source controlled by the compensation control circuitry 206.

In the embodiment shown in FIG. 12b the voltage acting on $R_{F1}$ is controlled. The compensation control circuitry may generate a digital correction value which is converted by a suitable voltage by a DAC 1202. In this example the compensation control circuitry 206 could simply comprise a look-up table (LUT) encoding the desired non-linear transfer function between monitored signal and correction value.

Figure 8A:
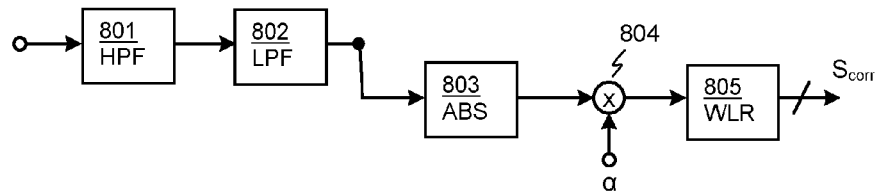
FIGS. 8a and 8b illustrate further embodiments of compensation circuitry.
Figure 8B:
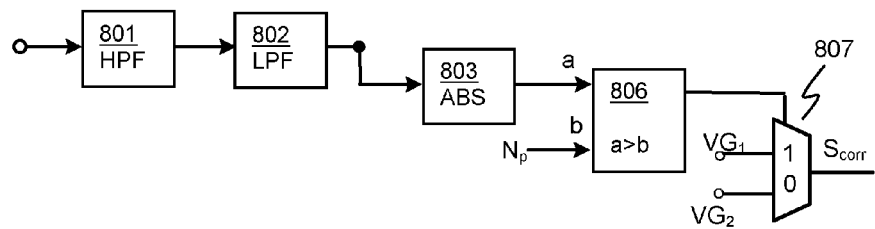

In some embodiments the compensation control circuitry may develop a suitable driving voltage itself without requiring a separate or further DAC. For example compensation control circuitry such as shown in FIG. 6 or 8b could be used with the inputs to multiplexors 603 or 807 being suitable driving voltages.

FIGS. 12a and 12b shows signal being monitored in the digital part of the signal path but clearly the signal could be monitored in the analogue part of the signal path. For example analogue comparators could be used in the compensation control circuitry illustrated in FIG. 6. In this case the signal is both monitored and modified in the analogue part of the signal path. Thus ADC 202 is not required for the distortion compensation circuitry.

Where the analogue signal is monitored the compensation control circuitry in the embodiment of FIG. 12a may be able to generate a desired control current itself and thus programmable current source 1201 may not be needed. For instance, compensation control circuitry such as described with reference to FIG. 3 may be used but with analogue squaring circuit 302 that generates a current proportional to the square of input analogue voltage level. The analogue squarer circuit may employ known techniques, e.g. based on MOS square law, to produce the required correction signal and may produce the required harmonics even if exact square law MOS circuitry is not used. It will be noted that again such correction would provide a wholly analogue loop which would provide essentially continuous correction, with no steps at bit boundaries.

As mentioned above the compensation circuitry may, in some instances, be arranged to modify the signal at a point along the signal path by scaling the signal or modulating the gain of an element in the signal path, in other words to provide a multiplicative correction signal. The compensation control circuitry may therefore comprise circuitry for generating a suitable polynomial. For example multiplying the signal, e.g. $S_{mon}$ by a value based on $(1+\alpha \cdot S_{mon})$, where a is suitable scaling factor would result in a resulting signal value of $S_{mon}+\alpha \cdot (S_{mon})^2$. Multiplying the signal based on such a polynomial will provide the second harmonics for correction of distortion in the input sense signal.

FIGS. 13a and 13b show two examples of compensation control circuitry for generating a multiplicative correction signal which could be used by suitable modification circuitry where the first point in the signal path where the signal is monitored is in the digital part of the signal path. As discussed previously the ADC 202 may well produce an oversampled 1-bit or few-bit (<8) output which may need low-pass filtering by filter 301 to increase the word length to give reasonable resolution. Filter 301 may form part of the signal path or may be provided just in the compensation circuitry path.

In the embodiment shown in FIG. 13a the filtered digital signal is multiplied by a scaling factor α by a digital multiplier 1301 and then a value of 1 is added by digital adder 1302. It will be noted that the sign of the input signal is maintained so that for positive input signals the output value is greater than 1. Thus the multiplicative correction signal will result in an increase in signal level for positive signals (making positive signals more positive). For negative input signal the output value is less than 1, result in a decrease in signal level for negative signals (making negative signals less negative).

It should be noted that the output multiplicative correction signal may contain components at 20 kHz, or some quantisation noise from the imperfect or economically small LPF, so there is some danger of mixing down ADC quantisation noise into the audio band by the multiplicative action. This may be reduced by an additional LPF before any multiplication, but possibly at the expense of making the word-length and hence the multiplier bigger.

FIG. 13b shows an alternative arrangement where the correction signal is only applied if the signal magnitude is above certain thresholds and the correction applied is fixed, at 1+α or 1−α. Comparators 1302 compared the monitored signal to a positive and negative threshold and control multiplexor 1304 to output a value of +α, 0 or −α to be added to a digital value 1.

The multiplicative correction signal may be used in a feed-forward embodiment or a feed-back embodiment. For instance, referring back to FIG. 5 is a feed-forward embodiment the digital signal may be monitored at points (c) or (d) and the correction could be applied at point (D) by a digital multiplier 502.

In a feedback arrangement the digital signal could be monitored at position (e) and again applied by a digital multiplier (D). In such an embodiment, the monitored signal $S_{mon}$ is the modified signal, i.e. a signal to which the multiplicative correction signal has been applied. As discussed above in relation to additive correction however the difference is small, and the modified signal can readily be used.

It would of course also be possible to monitor the analogue signal and the comparators shown in FIG. 13b for example may be analogue comparators.

In some embodiments the multiplicative correction signal may be used to modulate the gain of the ADC 202.

Figure 14:
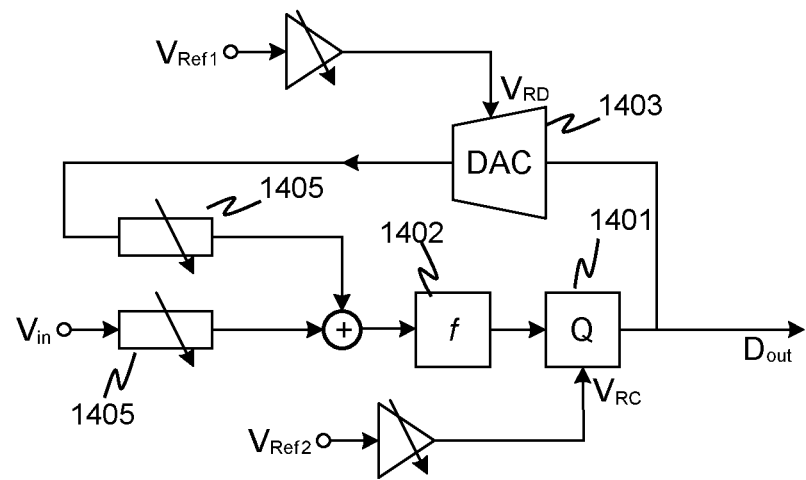
FIG. 14 illustrates generally the operation of an ADC and illustrates how the gain of the ADC may be modulated.

FIG. 14 illustrates, in general terms, the operation of an ADC and illustrates various ways in which the gain could be varied. In many ADCs, for example delta-sigma or pipeline or SAR (successive-approximation-register) ADCs, the digital output is generated by some single- or multi-bit quantiser Q 1401, possibly after some other processing f 1402. In some ADCs the quantiser 1401 is located in a feedback loop, with a feedback analogue signal from the quantiser being subtracted from the input Vin to provide an error signal that is used to drive the quantiser. There may therefore be a DAC 1403 located in a feedback path.

Figure 15:
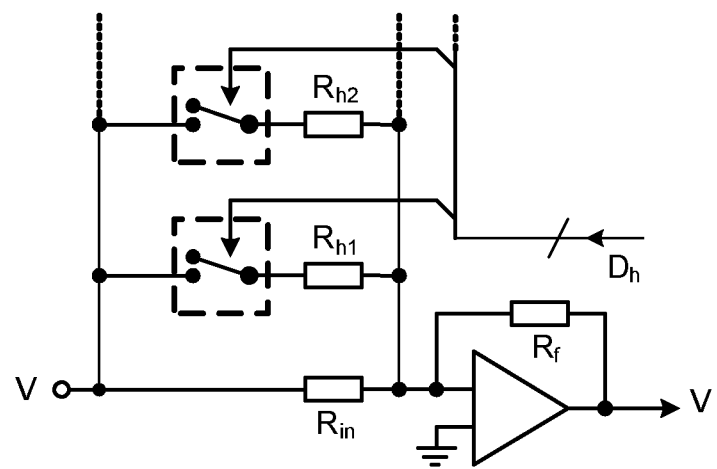
FIG. 15 illustrates one example of how the input resistance of an element in the analogue signal path could be modulated.

In such an ADC the input voltage Vin and feedback voltage Vfb are usually scaled via different impedances, an input impedance 1404 and a feedback impedance 1405. Increasing the input impendence 1404 for Vin will reduce gain as a greater input signal will be required for a given change in the output. Conversely increasing the feedback resistance 1405 will decrease the gain. Thus if at least one of these impedances was a programmable resistance the gain of the ADC could be modulated by varying the impedance (s). One or both of the input impedance or the feedback impedance may therefore be a programmable impedance. A programmable impedance may be implemented by connecting a selected number of resistors in parallel based on the correction signal. For instance referring back to FIG. 9, to alter the gain of the ADC the resistors Rh1 and Rh2 could instead be arranged to be switched in parallel with the input resistance Rin or the feedback resistance Rfb as required (or otherwise disconnected) in order to vary the gain of the ADC. In such an arrangement instead of being selectively connected between ground and a reference voltage the resistors would be selectively connected to the input signal or the feedback signal Qout respectively (or left disconnected). A correction signal for selecting the resistors, i.e. a gain control signal, could be derived in any of the ways described previously. FIG. 15 illustrates how a number of resistors Rh may be selectively connected in parallel within an input resistance Rin of an amplifier to modify the effective input resistance.

The same principle would apply to selectively connecting resistors in parallel with the feedback resistance. The signal $D_h$ for selecting the appropriate resistors can thus be seen as a correction signal having a value based on the weightings of the selected resistors which is combined with the input signal by modulating the gain of the ADC.

The ADC gain is also inversely proportional to a reference voltage $V_{RD}$ applied to feedback DAC. Thus varying the reference voltage $V_{RD}$ could additionally or alternatively be used to modulate the gain of the ADC. The reference voltage $V_{RD}$ could be generated by appropriate compensation control circuitry or the compensation control circuitry could be arranged to control a programmable level-shift circuit receiving a reference voltage so as to alter the feedback DAC voltage. For example the compensation control circuitry could control the number of resistors connected in series in a resistor array level shifting circuit.

In some instances, for instance flash converters, there may be no feedback path (or it may be low gain). In such ADCs the quantiser may be multi-level, with code boundaries set by set of voltage levels derived ratiometrically from a reference $V_{RC}$. Varying this reference $V_{RC}$ thus alters ADC gain. The reference $V_{RC}$ could be modified in the same way as $V_{RD}$ discussed above.

In embodiments of the present invention, any of these techniques may be used, alone or in combination, to modulate the gain of the ADC.

As mentioned the correction signal, for controlling the gain of the ADC, could be derived in any of the way described previously, for instance by using an appropriate look-up table, be comparing the monitored signal to one or more threshold to provide an appropriate correction value or using a polynomial generation function (the latter being most of use when there is a relatively fine degree of control over the gain).

The gain of an analogue element upstream of the ADC 202 may be also be modulated. For example, the gain of an intermediate amplifier stage between the input stage 201 and ADC 202 could be adjusted, for example in the same manner as illustrated in FIG. 15.

In some embodiments the gain of the input amplifier stage may be modified. FIG. 16 illustrates one embodiment of the amplifier input stage 201. As discussed previously the amplifier may be arranged as a charge amplifier with a feedback capacitor $C_{f0}$. An attenuation capacitor $C_{fATT}$ may be selectively connected in parallel with the feedback capacitor $C_{f0}$ to cope with large value signals. As discussed above in relation to FIG. 1c it is known to provide an attenuation capacitor to overload of an amplifier at high signal levels. Attenuation feedback capacitance $C_{fATT}$ can be used in a similar way to avoid overload at the output of a charge amplifier by reducing output voltage swing. The feedback capacitance $C_{fATT}$ is controlled by an attenuation signal, for instance derived from downstream monitoring of the signal level For example in embodiments where the signal is monitored digitally the monitored signal, which may be filtered, may also be used for controlling the attenuation feedback capacitance $C_{fATT}$.

The gain of the input stage is modulated by selectively switching in one or more additional feedback capacitances $C_{f1}$, $C_{f2}$ when required. Two additional feedback capacitances $C_{f1}$, $C_{f2}$ are illustrated in FIG. 16 but more could be provided to allow for greater control and the feedback capacitance could be weighted. The feedback capacitances are controlled by the compensation control circuitry. When an additional feedback capacitance is not selected it may still be driven with the feedback signal, but connected to ground, to avoid a jump in charge when selected.

The compensation control circuitry may generate a suitable control signal using any of the method described above. The compensation control circuitry may monitor the signal in the analogue part of the signal path or the digital part of the signal path. It will be clear however that modulating the gain of input stage will, when connected directly to a MEMS capacitive transducer, result in a feedback arrangement as the sense signal can't readily be monitored upstream of the input stage amplifier.

The various embodiments of the compensation control circuitry and modification circuitry and additive or multiplicative correction/gain control can be used in various combinations and may be implemented as feedback or feed-forward arrangements as suitable with all digital monitoring and correction, all analogue monitoring and correction or mixed signal monitoring and correction.

In some embodiments the signal processing circuit may additionally or alternatively correct for any changes in attenuation applied, within the read-out circuitry.

As discussed above in relation to FIG. 1c it is known to provide an attenuation capacitor that can be selectively switched into the circuit when required so as to attenuate the signal input into an amplifier to reduce the voltage range requirements of the amplifier. Connecting the attenuation capacitor may result in the amplifier output exhibiting distortion but this may be compensated as discussed above. As also discussed above in relation to FIG. 16 an attenuation feedback capacitance may also be provided in charge amplifier arrangements so as to avoid overload of the output of the amplifier.

Figure 16:
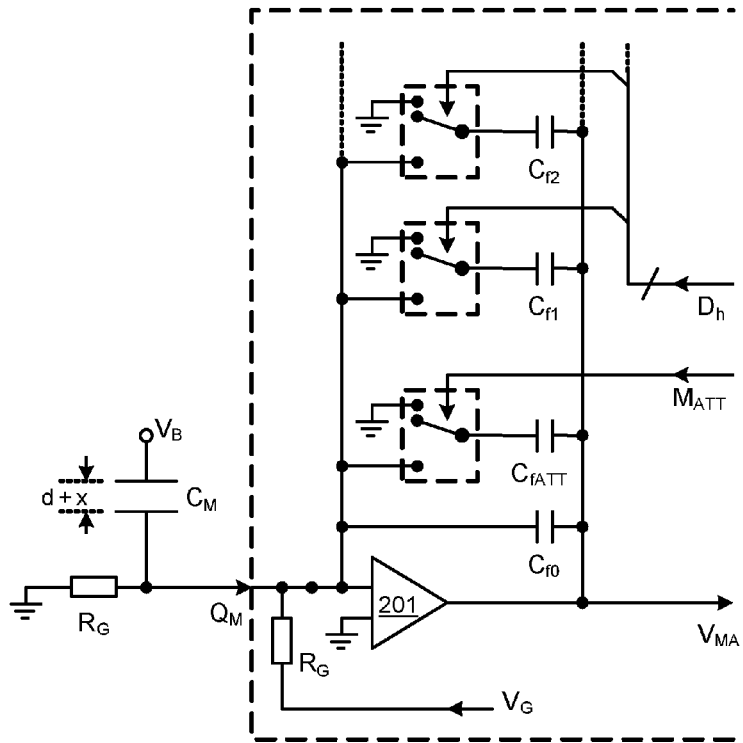
FIG. 16 illustrates an example of how the gain of the input amplifier stage could be modulated.

As well as leading possibly increasing distortion as described above connecting an attenuation capacitor, in either of the arrangements shown in FIG. 1c or FIG. 16, will result in a relatively sudden change in gain of the signal processing circuit. Such a change in gain could result in peculiar perceived audio effects, or may affect downstream processing such as noise cancellation or echo cancellation systems. Whenever the attenuation setting is changed an indication could be generated and output along with the signal to allow downstream processing to try to reconstruct the original signal. In embodiment of the present invention however the gain of at least one element in the signal path is altered at the same time that the attenuation is activated (or deactivated) to compensate for the attenuation.

Figure 17:
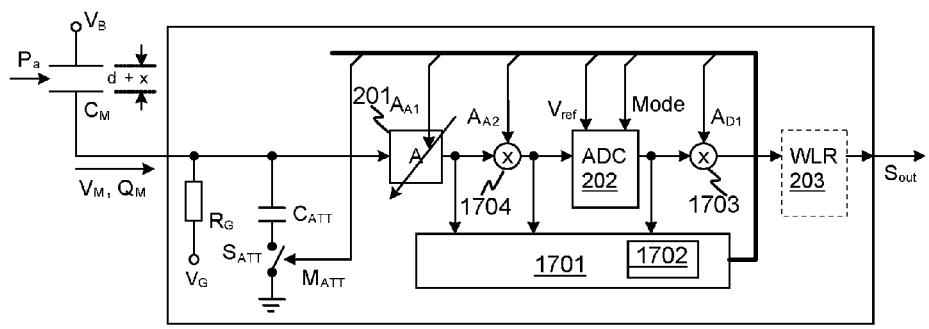
FIG. 17 illustrates another embodiment for modifying gain of at least one element in the signal path at the same time as an attenuation is applied.

FIG. 17 illustrates various embodiments of this aspect of the invention. FIG. 17 illustrates a voltage amplifier embodiment but the same principles apply equally to switching in a feedback capacitance for a charge amplifier.

Attenuation control circuitry 1701 monitors the signal level at at least one a point along the signal path, which may be in the analogue part of the signal path or the digital part of the signal path. The signal is monitored and used to detect whether the input signal level, or a derived signal envelope such as a rectified or peak-detected version of the signal, is sufficiently high such that the attenuation capacitor should be switched into the circuit (and also clearly with the attenuation applied whether the signal level has decreased sufficiently to remove the attenuation). Pre-emphasis filtering, for example to provide phase lead to advance the signal in time or differentiation to exaggerate any rising signal gradient, may be applied to the monitored signal to allow early detection so that the attenuation can be applied in time well before any clipping of the signal. A control signal $M_{ATT}$ is thus generated to control switching of the attenuation capacitor $C_{ATT}$. In this embodiment there is a single attenuation capacitor providing one level of attenuation and thus the attenuation control circuit may simply compare to signal level to a first threshold when no attenuation is applied and to a second threshold when attenuation is applied. In some embodiments however there may be more than one attenuation capacitor that can be independently selected to provide more than one level of attenuation.

The control signal $M_{ATT}$ is also applied to modify the gain of at least one component in the signal path to provide compensation to the overall system gain. The gain change is synchronised with the change in attenuation and thus may be applied at the same time that the attenuation is applied (possibly allowing for any propagation delays etc. along the signal path). The control circuit 1701 may include a zero-crossing detect circuit 1702 to detect when the instantaneous signal level is at or near zero. Any changes in attenuation and gain may then be synchronised to such times when the signal level is low to minimise the effect of any glitches as the attenuation/gain is applied. Obviously the gain change applied is an increase in gain when the input attenuation is increased and vice versa.

In some embodiments the gain of the ADC 202 may be modulated for example as described above in relation to FIG. 14. In particular the reference voltage level may be varied. Adjusting the gain of the ADC is particularly advantageous as few extra components are required and the gain adjustment is made in the digital domain, allowing the benefits of the attenuation in the analogue part of the signal path.

In some embodiments the gain adjustment could be implemented, at least partly, by a digital multiplier 1703 acting on the output of the ADC.

In some instances the gain of a variable gain amplification stage 1703 in the analogue part of the signal path could be controlled. The variable gain stage 1703 may be any type of programmable gain element that can amplify the signal to the required signal amplitude.

In some embodiments it may be that the attenuation is applied to keep the input signal level below a certain level but the output headroom of the input stage amplifier is sufficient to provide at least some of the required overall gain. Thus in some embodiments the input stage amplifier may be a variable gain amplifier and the control circuitry may adjust the gain of the variable gain input amplifier.

In some embodiments the ADC may also be programmable to operate in different modes according to the anticipated magnitude of its input signal as detected by some of the detector circuitry. For instance it may be a high-order delta-sigma modulator whose order is reduced or whose internal time constants are changed for signals approaching full scale to help stability and linearity at the expense of noise.

The ADC output, particularly if multiplied, may pass though a further digital modulation stage to reduce its word length. For instance the ADC may be a single-bit output, but subject to multiplication by say a 4-bit word, to produce a 4-bit product. This may be reduced to single-bit by a further delta-sigma modulator or noise-shaping word-length reduction stage.

The embodiments described above may be used as read-out circuitry for MEMS transducers, i.e. circuits to which a MEMS transducer and appropriate bias impedance may be connected, for example as shown in FIG. 2. In other words the input amplifier stage 201 may provide the first amplification of the sense signal from the MEMS capacitive transducer. Typically the signal processing circuit would be implemented as an integrated circuit. Typically the MEMS transducer will be fabricated separately to the read-out circuitry, i.e. on different wafers, and the MEMS transducer will be connected to the contacts on the read-out circuitry. It is known however to form MEMS transducers and read-out circuitry on the same wafer and thus at least some of the circuitry of the signal path could be provided on the same chip as the MEMS transducer. Likewise the bias impedance may typically be external to the read-out integrated circuit and connected thereto but could be formed as part of the integrated circuit in some embodiments.

The read-out circuitry may be packaged with the MEMS transducer for example in a suitable housing. The MEMS transducer may be formed on a base, which may have a cavity therein to form a sound port and/or acoustic volume. A housing may be attached to the base and enclose the MEMS transducer and read-out circuitry. There may be a sound port in the housing or the housing may be substantially sealed. The housing may be formed from a metal or may be fabricated from a semiconductor material for example. The housing may comprise a cavity in a substrate material. In some embodiments the MEMS transducer may be formed on a base and surrounded by one or more side walls with a lid portion completing the package. At least part of the package may be formed from a printed circuit board material.

In some embodiments however the signal correction for distortion components may be applied to a signal which is output from some initial stage read-out circuitry. Thus the MEMS transducer could be connected to some initial read-out circuitry which would include an amplifier and possibly an ADC. The output of this initial stage read-out circuitry could be received by a signal processing circuit having compensation circuitry as discussed above, e.g. a distortion compensation circuit. As the initial read-out circuitry will include an amplifier the distortion compensation circuit may not require an amplifier—although if an analogue signal is received there may be a desire for some additional amplification, and/or an amplifier with a variable gain could be provided to allow for gain based correction as discussed above. If the read-out circuitry includes an ADC the signal received by the distortion compensation circuitry may be a digital signal, in which case an ADC may not be required in the signal path of the distortion compensation circuit. Any of the methods discussed above in relation to wholly digital correction schemes could then be applied.

In general then an embodiment of the invention provides a distortion compensation circuit having an input for receiving a first signal derived from a MEMS capacitive transducer and compensation circuitry for modifying the first signal to compensate for distortions in the first signal, wherein the compensation circuitry applies a modification based on the first signal. The compensation circuitry may generate a correction signal to be added to the first signal based on the value of the first signal (before or after correction). The additive correction signal may be based on the value of the first signal squared or on the absolute value of the first signal. The compensation circuitry may generate a correction signal to be used to scale the first signal based on the value of the first signal (before or after correction), i.e. a multiplicative correction value. The multiplicative correction signal may be based on $(1+\alpha \cdot S)$ where S is the value of the first signal and $\alpha$ is a scaling factor.

Embodiments of the present invention may be used with MEMS or similar capacitive transducers, especially MEMS microphones. Embodiments of the invention may be arranged as part of an audio and/or signal processing circuit, for instance an audio circuit which may be provided in a host device. Embodiments of the invention also relate to MEMS or similar capacitive ultrasonic receiver circuits. A circuit according to an embodiment of the present invention may be implemented as an integrated circuit and may be implemented in a host device, especially a portable and/or battery powered host device such as a mobile telephone, an audio player, a video player, a PDA, a mobile computing platform such as a laptop computer or tablet and/or a games device for example.

Embodiments of the invention have been described above principally in terms of input signals from MEMS capacitive transducers such as MEMS microphones. Such MEMS microphones may be audio microphones suitable for responding to input stimuli at audio frequencies, for example sounds that are audible by the human ear (for example in the frequency range of 20 Hz-20 kHz). Embodiments of the invention may additionally or alternatively be operable at ultrasonic frequencies (for example in the frequency range of 20 kHz-300 kHz) and the transducers may therefore be ultrasonic transducers capable of operating in such a frequency range. Embodiments of the invention may additionally or alternatively be operable at infrasonic frequencies (typically at frequencies below 20 Hz) and embodiments may include infrasonic transducers operable at such frequencies or haptic transducers (typically operable at frequencies below 20 Hz, or at least below 300 Hz).

It will, of course, be appreciated that the embodiments described above may be implemented with other types of transducer. For instance the embodiments may be implemented with other types of MEMS transducer, for instance pressure sensors, accelerometers, magnetometers, gyroscopic sensors or the like. Such other MEMS transducers may be capacitive in nature. Some embodiments of the invention may however be implemented with resistive MEMS transducers and/or inductive MEMS transducers.

Whilst embodiments of the invention are particularly suited for implementation with MEMS transducers, which can represent particular challenges due to the relatively small signals produced in use, it will be understood that the principles discussed above are applicable to other types of capacitive transducer and thus embodiments of the invention may also be implemented with other types of capacitive transducers that may not be MEMS transducers, whether microphones or other transducers such as pressure sensors, accelerometers, magnetometers, gyroscopic sensors or the like.

The skilled person will recognise that various embodiments of the above-described apparatus and methods may be, at least partly, implemented using programmable components rather than dedicated hardwired components. Thus embodiments of the apparatus and methods may be, at least partly embodied as processor control code, for example on a non transitory carrier medium such as a disk, CD- or DVD-ROM, programmed memory such as read only memory (Firmware), or on a data carrier such as an optical or electrical signal carrier. In some applications, embodiments of the invention may be implemented, at least partly, by a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as reprogrammable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A signal processing circuit for a MEMS capacitive transducer, the transducer producing, in use, a sense signal in response to an input stimulus, the signal processing circuit comprising:
a signal path between an input for receiving said sense signal and an output for outputting an output signal based on said sense signal; and
compensation circuitry configured to:
monitor the signal at a first point along the signal path and generate a correction signal; and
modify the signal at at least a second point along said signal path based on said correction signal by adding said correction signal to the signal at said second point along the signal path wherein said correction signal is generated to comprise at least one harmonic component generated from any fundamental signal component at said first point;
wherein said correction signal is generated as a function of the value of the signal at the first point along the signal path so as to introduce compensation components into the output signal that compensate for distortion components in the sense signal.

2. A signal processing circuit as claimed in claim 1 wherein the first point in the signal path is after the second point in the signal path.

3. A signal processing circuit as claimed in claim 1 wherein said correction signal is generated as a function of the square of the value of the signal at said first point and said compensation circuitry comprises squaring circuitry for producing said correction signal.

4. A signal processing circuit as claimed in claim 1 wherein said correction signal is generated as a function of the absolute value of the signal at said first point and said compensation circuitry comprises rectification circuitry for producing said correction signal.

5. A signal processing circuit as claimed in claim 1 wherein said correction signal is generated as a function of the value of the monitored signal relative to one or more thresholds and said compensation circuitry comprises at least one comparator configured to compare a signal based on the signal at the first point with said one or more thresholds and generate said correction signal having a selected one of a plurality of predefined values based on said comparison.

6. A signal processing circuit as claimed in claim 5 comprising at least one multiplexor having predefined correction values as input wherein said multiplexor is configured to be controlled by the output of said at least one comparator.

7. A signal processing circuit as claimed in claim 1 wherein the correction signal is added to an analogue part of the signal path and the circuit comprises at least a first analogue amplifier stage located in the analogue part of the signal path wherein the said second point is the input to said first analogue amplifier stage.

8. A signal processing circuit as claimed in claim 1 comprising an analogue-to-digital converter wherein the second point in the signal path is the input to the analogue-to-digital converter.

9. A signal processing circuit as claimed in claim 1 wherein the first point in the signal path is before the second point in the signal path.

10. A signal processing circuit as claimed in claim 1 wherein signal path comprises a charge amplifier arranged as an input amplifier stage to receive the sense signal.

11. A signal processing circuit as claimed in claim 1 wherein the compensation circuitry comprises a low pass filter for producing a filtered version of the signal at the first point in the signal path.

12. A signal processing circuit as claimed in claim 11 wherein the filtered version of the signal at the first point in the signal path is provided as a separate output of the compensation circuitry in addition to the correction signal.

13. A signal processing circuit as claimed in claim 1 wherein the signal path comprises an amplifier and the circuit further comprises attenuation circuitry for applying a selectively variable attenuation to the sense signal to be amplified and wherein the compensation circuitry is further configured to modify the signal at a point in the signal path downstream of the input to the amplifier to compensate for attenuation applied by said attenuation circuitry.

14. A signal processing circuit as claimed in claim 1 wherein said compensation circuitry is responsive to at least one stored setting value to define said function for generating the correction signal and comprising a programmable element for storing at least one said stored setting value.

15. An electronic device comprising a signal processing circuit as claimed in claim 1 wherein said electronic device is at least one of: a portable device, a battery powered device, a computing device, a communications device; a gaming device; a mobile telephone; a laptop computer; and a tablet computer.

16. A signal processing circuit for a MEMS capacitive transducer, the transducer producing, in use, a sense signal in response to an input stimulus, the signal processing circuit comprising:

a signal path between an input for receiving said sense signal and an output for outputting an output signal based on said sense signal; and compensation circuitry configured to:
    monitor the signal at a first point along the signal path and generate a correction signal; and
    modify the signal at at least a second point along said signal path based on said correction signal by modulating the gain of at least one component in the signal path based on said correction signal so as to scale the value of the signal at the second point;
    wherein said correction signal is generated:
        as a function of the value of the signal at the first point along the signal path so as to introduce compensation components into the output signal that compensate for distortion components in the sense signal; and
        so as to scale the gain in accordance with a value proportional to $(1+\alpha \cdot V_s)$ where $\alpha$ is a predetermined value and $V_s$ is the value of the signal at the first point.

17. A signal processing circuit as claimed in claim 16 wherein said correction signal is generated as a function of the value of the monitored signal relative to one or more thresholds.

18. A signal processing circuit as claimed in claim 16 comprising at least a first analogue amplifier stage located in the analogue part of signal path wherein the compensation circuitry modulates the gain of said first analogue amplifier stage.

19. A signal processing circuit as claimed in claim 16 comprising an analogue-to-digital converter wherein the compensation circuitry modulates the gain of said analogue-to-digital converter.

20. A signal processing circuit for reducing distortion in an electrical sense signal produced by a transducer, the signal processing circuit comprising:

a signal path between an input for receiving said sense signal and an output for outputting an output signal based on said sense signal; and compensation circuitry for generating a correction signal as a function of the instantaneous value of the signal present at a first point along said signal path and for combining the correction signal with the signal present at a second point along said signal path, wherein said compensation circuitry is configured to modify said signal by adding said correction signal to the signal at said second point along the signal path wherein said correction signal is generated to comprise at least one harmonic component generated from any fundamental signal component at said first point.

* * * * *